United States Patent
Iso et al.

(10) Patent No.: US 11,371,140 B2
(45) Date of Patent: *Jun. 28, 2022

(54) METHOD FOR PRODUCING GAN CRYSTAL

(71) Applicants: MITSUBISHI CHEMICAL CORPORATION, Tokyo (JP); NATIONAL UNIVERSITY CORPORATION TOKYO UNIVERSITY OF AGRICULTURE AND TECHNOLOGY, Fuchu (JP)

(72) Inventors: Kenji Iso, Tokyo (JP); Akinori Koukitu, Tokyo (JP); Hisashi Murakami, Tokyo (JP)

(73) Assignees: MITSUBISHI CHEMICAL CORPORATION, Tokyo (JP); NATIONAL UNIVERSITY CORPORATION TOKYO UNIVERSITY OF AGRICULTURE AND TECHNOLOGY, Fuchu (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/178,423

(22) Filed: Feb. 18, 2021

(65) Prior Publication Data

US 2021/0172061 A1    Jun. 10, 2021

Related U.S. Application Data

(63) Continuation of application No. 16/130,617, filed on Sep. 13, 2018, now Pat. No. 10,961,619, which is a
(Continued)

(30) Foreign Application Priority Data

Mar. 15, 2016   (JP) .............................. JP2016-050395
Sep. 5, 2016   (JP) .............................. JP2016-173103
(Continued)

(51) Int. Cl.
    *C30B 25/20*     (2006.01)
    *C23C 16/34*     (2006.01)
    (Continued)

(52) U.S. Cl.
    CPC ............ *C23C 16/34* (2013.01); *C23C 16/303* (2013.01); *C23C 16/4488* (2013.01);
    (Continued)

(58) Field of Classification Search
    CPC ....... C30B 23/205; C30B 25/20; C30B 29/38; C30B 29/406; H01L 21/02389;
    (Continued)

(56) References Cited

U.S. PATENT DOCUMENTS 10,961,619 B2 *   3/2021   Iso .......................... C23C 16/34
2011/0089536 A1    4/2011   Brandes et al.
(Continued)

FOREIGN PATENT DOCUMENTS

CN          1545130 A     11/2004
CN       102782966 A     11/2012
(Continued)

OTHER PUBLICATIONS

Chinese Office Action dated Jul. 3, 2020 for the corresponding Chinese Patent Application No. 201780016941.6.
(Continued)

*Primary Examiner* — Robert M Kunemund
(74) *Attorney, Agent, or Firm* — Element IP, PLC

(57) ABSTRACT

A method for producing a GaN crystal that includes: (i) a seed crystal preparation step of preparing a GaN seed crystal having one or more facets selected from a {10-10} facet and a {10-1-1} facet; and (ii) a growth step of growing GaN
(Continued)

from vapor phase on a surface comprising the one or more facets of the GaN seed crystal using $GaCl_3$ and $NH_3$ as raw materials.

15 Claims, 18 Drawing Sheets

Related U.S. Application Data continuation of application No. PCT/JP2017/007451, filed on Feb. 27, 2017.

(30) Foreign Application Priority Data

Sep. 5, 2016 (JP) .............................. JP2016-173104
Sep. 27, 2016 (JP) .............................. JP2016-187698

(51) Int. Cl.

| | |
|---|---|
| C30B 29/38 | (2006.01) |
| C30B 29/40 | (2006.01) |
| C23C 16/30 | (2006.01) |
| H01L 21/205 | (2006.01) |
| C23C 16/448 | (2006.01) |
| C30B 23/02 | (2006.01) |
| H01L 21/02 | (2006.01) |

(52) U.S. Cl.
CPC ............ *C30B 23/025* (2013.01); *C30B 25/20* (2013.01); *C30B 29/38* (2013.01); *C30B 29/406* (2013.01); *H01L 21/0254* (2013.01); *H01L 21/0262* (2013.01); *H01L 21/02107* (2013.01); *H01L 21/02389* (2013.01); *H01L 21/02433* (2013.01); *H01L 21/205* (2013.01)

(58) Field of Classification Search
CPC ........... H01L 21/02433; H01L 21/0254; H01L 21/0262; H01L 21/205
See application file for complete search history.

(56) References Cited

U.S. PATENT DOCUMENTS

| | | |
|---|---|---|
| 2011/0216795 A1 | 9/2011 | Hsu et al. |
| 2011/0223701 A1 | 9/2011 | Kyono et al. |
| 2011/0299560 A1 | 12/2011 | Takagi et al. |
| 2012/0074403 A1 | 3/2012 | Fujiwara et al. |
| 2013/0130477 A1 | 5/2013 | Koukitu et al. |
| 2013/0181240 A1 | 7/2013 | Chen et al. |
| 2013/0200391 A1 | 8/2013 | Bedair |
| 2014/0167059 A1 | 6/2014 | Hsu et al. |
| 2014/0318457 A1 | 10/2014 | Umezawa |
| 2014/0328742 A1 | 11/2014 | Mori et al. |
| 2015/0233821 A1 | 8/2015 | Seo |
| 2015/0311068 A1 | 10/2015 | Tsukada et al. |
| 2016/0186361 A1 | 6/2016 | Koukitu et al. |

FOREIGN PATENT DOCUMENTS

| | | |
|---|---|---|
| CN | 102934302 A | 2/2013 |
| CN | 103124811 A | 5/2013 |
| CN | 104040039 A | 9/2014 |
| CN | 104662678 A | 5/2015 |
| JP | 2007220975 A | 8/2007 |
| JP | 2008308356 A | 12/2008 |
| JP | 2009126721 A | 6/2009 |
| JP | 2012066983 A | 4/2012 |
| JP | 2013170096 A | 9/2013 |
| JP | 2013212945 A | 10/2013 |
| JP | 2013227201 A | 11/2013 |
| JP | 2015013791 A | 1/2015 |
| TW | 201435164 A | 9/2014 |
| WO | WO-2007143743 A | 12/2007 |
| WO | WO-2011142402 A1 | 11/2011 |
| WO | WO-2014097931 A1 | 6/2014 |
| WO | WO-2015037232 A3 | 3/2015 |

OTHER PUBLICATIONS

International Search Report dated May 23, 2017 for the corresponding PCT International Patent Application No. PCT/JP2017/007451.
Kenji Iso et al., "Quasiequilibrium crystal shape and kinetic Wulff plot for GaN grown by trihalide vapor phase epitaxy using GaCl3", Phys. Status Solidi B, Feb. 6, 2017, pp. 1-6, 1600679.
Kenji Iso et al., "Thick nonpolar m-plane and semipolar (1011) GaN on an ammonothermal seed by tri-halide vapor-phase epitaxy using GaCl3", Journal of Crystal Growth, Jan. 5, 2017, pp. 25-29, vol. 461.
Kenji Iso et al., "Tri-halide vapor-phase epitaxy of GaN using GaCl3 on polar, semipolar, and nonpolar substrates", Applied Physics Express 9, Sep. 12, 2016, p. 105501-1 to 105501-4.
Office Action dated Jan. 5, 2021 in Japanese Patent Application No. 2017-045195 (with English translation), 8 pages.
Office Action dated Oct. 20, 2020 in Japanese Patent Application No. 2019-167214 (with English computer-generated translation).
Translation of the International Preliminary Report on Patentability dated Sep. 27, 2018 for the corresponding PCT International Patent Application No. PCT/JP2017/007451.
Office Action and Search Report dated May 21, 2021 in Chinese Patent Application No. 201780016941.6 (with English mechanical translation).
Chinese Office Action dated Jul. 3, 2020 for the corresponding Chinese Patent Application No. 201780016941.6 (with English computer-generated translation).
Office Action dated May 25, 2021 issued in corresponding JP Application No. 2019-167214 with English Mechanical Translation, 5 pages.
Office Action dated Dec. 21, 2021 in Japanese Patent Application No. 2019-167214 (with English machine translation), 5 pages.

\* cited by examiner

METHOD FOR PRODUCING GAN CRYSTAL

CROSS-REFERENCE TO RELATED APPLICATION

This is a continuation of U.S. patent application Ser. No. 16/130,617 filed Sep. 13, 2018 now U.S. Pat. No. 10,961,619, which is a continuation of International Application No. PCT/JP2017/007451, filed on Feb. 27, 2017, and designated the U.S., and claims priority from Japanese Patent Application 2016-050395 filed on Mar. 15, 2016, Japanese Patent Application 2016-173103 which was filed on Sep. 5, 2016, Japanese Patent Application 2016-173104 which was filed on Sep. 5, 2016, and Japanese Patent Application 2016-187698 which was filed on Sep. 27, 2016, the entire contents of which are incorporated herein by reference.

TECHNICAL FIELD

The present invention relates mainly to a method for producing a GaN (gallium nitride) crystal.

BACKGROUND ART

A method using $GaCl_3$ (gallium trichloride) as a Ga (Gallium) source in vapor phase growth of a GaN crystal has been proposed for some time.

Gaseous $GaCl_3$ can be generated by vaporizing solid $GaCl_3$ (Patent Document 1).

It has been shown that gaseous $GaCl_3$ having higher purity can be obtained by reacting metal Ga and $Cl_2$ (chlorine gas) with each other to produce GaCl (gallium monochloride) and further reacting the produced GaCl with $Cl_2$ (Patent Documents 2 and 3).

Patent Document 2 describes an experimental result where growth of GaN from vapor phase was achieved on a sapphire (0001) substrate using $GaCl_3$ and $NH_3$ (ammonia) as raw materials; however, the orientation of the GaN crystal grown is unclear.

Patent Document 3 describes an experimental result where growth of GaN from vapor phase was achieved on a GaN (000-1) substrate using $GaCl_3$ and $NH_3$ as raw materials.

To the best of the present inventors' knowledge, no one has hitherto tried to grow GaN on a non-polar or semi-polar GaN surface using $GaCl_3$ as a raw material.

PRIOR ART DOCUMENT

Patent Documents

Patent Document 1: WO2007/143743
Patent Document 2: WO2011/142402
Patent Document 3: WO2015/037232

SUMMARY OF INVENTION

Problem to be Solved by Invention

A main object of the present invention is to provide a novel method for producing a GaN crystal, the method including growing GaN from vapor phase on a semi-polar or non-polar GaN surface using $GaCl_3$ and $NH_3$ as raw materials.

The object of the present invention includes providing a novel method for producing a GaN crystal, the method including growing GaN from vapor phase using $GaCl_3$ and $NH_3$ as raw materials.

Solution to Problem

The present inventors tried to grow GaN from vapor phase on a non-polar or semi-polar GaN surface using $GaCl_3$ and $NH_3$ as raw materials and thereby found out that when the non-polar or semi-polar GaN surface has a particular orientation, GaN is growable thereon. One aspect of the present invention was made based on such findings.

Embodiments of the present invention include the following.

(1) A method for producing a GaN crystal, comprising: (i) a seed crystal preparation step of preparing a GaN seed crystal having a non-polar or semi-polar surface whose normal direction forms an angle of 85° or more and less than 170° with a [0001] direction of the GaN seed crystal; and (ii) a growth step of growing GaN from vapor phase on a surface comprising the non-polar or semi-polar surface of the GaN seed crystal using $GaCl_3$ and $NH_3$ as raw materials.

(2) The method for producing a GaN crystal according to (1) above, wherein the angle formed by the normal direction of the non-polar or semi-polar surface with the [0001] direction of the GaN seed crystal is 85° or more and less than 90°, 90° or more and less than 93°, 93° or more and less than 97°, 97° or more and less than 102°, 102° or more and less than 107°, 107° or more and less than 112°, 112° or more and less than 122°, or 122° or more and less than 132°.

(3) The method for producing a GaN crystal according to (1) or (2) above, wherein the angle formed by the normal direction of the non-polar or semi-polar surface with the direction of the GaN seed crystal is 87° or less or 93° or more.

(4) The method for producing a GaN crystal according to any one of (1) to (3) above, wherein in the growth step, GaN is grown on the non-polar or semi-polar surface at a growth rate of 1 μm/h or more.

(5) The method for producing a GaN crystal according to (4) above, wherein the growth rate is 50 μm/h or more.

(6) The method for producing a GaN crystal according to (4) or (5) above, wherein the growth rate is less than 150 μm/h.

(7) The method for producing a GaN crystal according to any one of (1) to (4) above, wherein in the growth step, $GaCl_3$ is supplied to the GaN seed crystal at a partial pressure of $1.5 \times 10^{-3}$ atm or more.

(8) The method for producing a GaN crystal according to any one of (1) to (4) and (7) above, wherein in the growth step, a product of partial pressures of $GaCl_3$ and $NH_3$ supplied to the GaN seed crystal is $9.5 \times 10^{-5}$ atm$^2$ or more.

(9) The method for producing a GaN crystal according to any one of (1) to (8) above, wherein an intersection line between the non-polar or semi-polar surface and a C-plane of the GaN seed crystal extends in an a-axis direction±15°.

(10) The method for producing a GaN crystal according to (9) above, wherein the intersection line extends in an a-axis direction±3°.

(11) The method for producing a GaN crystal according to any one of (1) to (10) above, wherein a low-index orientation of the GaN seed crystal parallel or nearest parallel to the normal of the non-polar or semi-polar surface is <10-10>, <30-3-1>, <20-2-1>, <30-3-2>, or <10-1-1>.

(12) The method for producing a GaN crystal according to any one of (1) to (11) above, wherein the GaN seed crystal is at least part of a GaN substrate, and the non-polar or semi-polar surface is a main surface of the GaN substrate.

(13) The method for producing a GaN crystal according to (12) above, wherein the GaN substrate is a GaN single crystal substrate.

(14) The method for producing a GaN crystal according to (12) above, wherein the GaN substrate is a template substrate comprising a base substrate and a GaN single crystal layer grown on the base substrate.

(15) The method for producing a GaN crystal according to (12) above, wherein the GaN substrate is a GaN layer-bonded substrate comprising a base substrate and a GaN single crystal layer bonded to the base substrate.

(16) The method for producing a GaN crystal according to any one of (12) to (15) above, wherein in the growth step, a bulk GaN crystal having a maximum growth height of 300 µm or more on the non-polar or semi-polar surface is grown.

(17) The method for producing a GaN crystal according to (16) above, wherein the maximum growth height of the bulk GaN crystal is 300 µm or more and less than 500 µm, 500 µm or more and less than 1 mm, 1 mm or more and less than 3 mm, 3 mm or more and less than 5 mm, 5 mm or more and less than 10 mm, 10 mm or more and less than 25 mm, 25 mm or more and less than 50 mm, 50 mm or more and less than 75 mm, 75 mm or more and less than 100 mm, or 100 mm or more and less than 200 mm.

(18) A method for producing a GaN crystal, comprising: (i) a seed crystal preparation step of preparing a GaN seed crystal having one or more facets selected from a $\{10\text{-}10\}$ facet and a $\{10\text{-}1\text{-}1\}$ facet; and (ii) a growth step of growing GaN from vapor phase on a surface comprising the one or more facets of the GaN seed crystal using $GaCl_3$ and $NH_3$ as raw materials.

(19) The method for producing a GaN crystal according to (18) above, wherein in the GaN seed crystal, a ratio of a size in a direction of a c-axis to a size in an arbitrary direction perpendicular to the c-axis is not less than 0.1 and not more than 10.

(20) The method for producing a GaN crystal according to (18) or (19) above, wherein each of the one or more facets is an as-grown surface.

(21) The method for producing a GaN crystal according to any one of (18) to (20) above, wherein the GaN seed crystal further has a (000-1) facet.

(22) The method for producing a GaN crystal according to (21) above, wherein in the growth step, GaN is also grown on the (000-1) facet.

(23) The method for producing a GaN crystal according to any one of (18) to (22) above, wherein in the growth step, GaN is grown on each of the one or more facets at a growth rate of 1 µm/h or more.

(24) The method for producing a GaN crystal according to (23) above, wherein the growth rate is 50 µm/h or more.

(25) The method for producing a GaN crystal according to (23) or (24) above, wherein the growth rate is less than 150 µm/h.

(26) The method for producing a GaN crystal according to any one of (18) to (23) above, wherein in the growth step, $GaCl_3$ is supplied to the GaN seed crystal at a partial pressure of $1.5\times10^{-3}$ atm or more.

(27) The method for producing a GaN crystal according to any one of (18) to (23) and (26) above, wherein in the growth step, a product of partial pressures of $GaCl_3$ and $NH_3$ supplied to the GaN seed crystal is $9.5\times10^{-3}$ atm$^2$ or more.

(28) The method for producing a GaN crystal according to any one of (1) to (27) above, wherein in the growth step, growth of GaN is repeated intermittently.

(29) The method for producing a GaN crystal according to any one of (1) to (28) above, wherein the $GaCl_3$ is generated by reacting metal Ga and $Cl_2$ with each other to produce GaCl and reacting the produced GaCl with $Cl_2$.

(30) The method for producing a GaN crystal according to any one of (1) to (29) above, wherein in the growth step, GaN is grown at a growth temperature of 1200° C. or more.

(31) A method for producing a GaN wafer, comprising: a crystal production step of producing a GaN crystal by the method for producing a GaN crystal according to any one of (1) to (30) above; and a crystal processing step of processing the GaN crystal produced in the crystal production step to form at least one GaN wafer.

(32) The method for producing a GaN wafer according to (31) above, wherein the GaN wafer formed in the crystal processing step includes a GaN wafer selected from a $\{10\text{-}10\}$ wafer, a $\{30\text{-}3\text{-}1\}$ wafer, a $\{20\text{-}2\text{-}1\}$ wafer, a $\{30\text{-}3\text{-}2\}$ wafer, a $\{10\text{-}1\text{-}1\}$ wafer, a $\{30\text{-}31\}$ wafer, a $\{20\text{-}21\}$ wafer, a $\{30\text{-}32\}$ wafer, a $\{10\text{-}11\}$ wafer, a (0001) wafer, and a (000-1) wafer.

(33) A method for producing a GaN crystal, comprising: (i) a seed crystal preparation step of preparing a GaN wafer as a seed crystal, the GaN wafer being a $\{20\text{-}2\text{-}1\}$ wafer; and (ii) a growth step of growing GaN from vapor phase on the GaN wafer using $GaCl_3$ and $NH_3$ as raw materials.

(34) The method for producing a GaN crystal according to (33) above, wherein in the growth step, GaN is grown at a growth rate of 1 µm/h or more.

(35) The method for producing a GaN crystal according to (34) above, wherein the growth rate is 1 µm/h or more and less than 50 µm/h, 50 µm/h or more and less than 100 µm/h, or 100 µm/h or more and less than 150 µm/h.

(36) The method for producing a GaN crystal according to (33) or (34) above, wherein in the growth step, $GaCl_3$ is supplied to the GaN wafer at a partial pressure of $1.5\times10^{-3}$ atm or more.

(37) The method for producing a GaN crystal according to (33), (34) or (36) above, wherein in the growth step, a product of partial pressures of $GaCl_3$ and $NH_3$ supplied to the GaN wafer is $9.5\times10^{-5}$ atm$^2$ or more.

(38) The method for producing a GaN crystal according to any one of (33) to (37) above, wherein in the growth step, a GaN crystal comprising a portion where an FWHM of a (201) plane X-ray rocking curve is less than 100 arcsec is formed on the GaN wafer.

(39) The method for producing a GaN crystal according to any one of (33) to (38) above, wherein the $GaCl_3$ is generated by reacting metal Ga and $Cl_2$ with each other to produce GaCl and reacting the produced GaCl with $Cl_2$.

(40) The method for producing a GaN crystal according to any one of (33) to (39) above, wherein in the growth step, GaN is grown at a growth temperature of 1200° C. or more.

(41) A method for producing a GaN wafer, comprising: producing a GaN crystal by the method for producing a GaN crystal according to any one of (33) to (40) above; and subsequently processing the produced GaN crystal to form a GaN $\{20\text{-}21\}$ wafer.

(42) A method for producing a GaN crystal, comprising: (i) a seed crystal preparation step of preparing a GaN wafer, the GaN wafer being a $\{10\text{-}10\}$ wafer; and (ii) a growth step of growing GaN from vapor phase on the GaN wafer using $GaCl_3$ and $NH_3$ as raw materials.

(43) The method for producing a GaN crystal according to (42) above, wherein in the growth step, GaN is grown at a growth rate of 1 µm/h or more.

(44) The method for producing a GaN crystal according to (43) above, wherein the growth rate is 1 µm/h or more and less than 50 µm/h, 50 µm/h or more and less than 100 µm/h, or 100 µm/h or more and less than 150 µm/h.

(45) The method for producing a GaN crystal according to (42) or (43) above, wherein in the growth step, $GaCl_3$ is supplied to the GaN wafer at a partial pressure of $1.5 \times 10^{-3}$ atm or more.

(46) The method for producing a GaN crystal according to (42), (43) or (45) above, wherein in the growth step, a product of partial pressures of $GaCl_3$ and $NH_3$ supplied to the GaN wafer is $9.5 \times 10^{-5}$ atm$^2$ or more.

(47) The method for producing a GaN crystal according to any one of (42) to (46) above, wherein in the growth step, a GaN crystal comprising a portion where an FWHM of a (100) plane X-ray rocking curve is less than 100 arcsec is formed on the GaN wafer.

(48) The method for producing a GaN crystal according to any one of (42) to (47) above, wherein the $GaCl_3$ is generated by reacting metal Ga and $Cl_2$ with each other to produce GaCl and reacting the produced GaCl with $Cl_2$.

(49) The method for producing a GaN crystal according to any one of (42) to (48) above, wherein in the growth step, GaN is grown at a growth temperature of 1200° C. or more.

(50) A method for producing a GaN wafer, comprising: producing a GaN crystal by the method for producing a GaN crystal according to any one of (42) to (49) above; and subsequently processing the produced GaN crystal to form a GaN {10-10} wafer.

(51) A method for producing a GaN crystal, comprising: (i) a seed crystal preparation step of preparing a GaN seed crystal having a {10-10} surface; and (ii) a growth step of growing GaN from vapor phase on the {10-10} surface using $GaCl_3$ and $NH_3$ as raw materials.

(52) The method for producing a GaN crystal according to (51) above, wherein in the growth step, GaN is grown on the {10-10} surface at a growth rate of 1 µm/h or more.

(53) The method for producing a GaN crystal according to (52) above, wherein the growth rate is 1 µm/h or more and less than 50 µm/h, 50 µm/h or more and less than 100 µm/h, or 100 µm/h or more and less than 150 µm/h.

(54) The method for producing a GaN crystal according to (51) or (52) above, wherein in the growth step, $GaCl_3$ is supplied to the GaN seed crystal at a partial pressure of $1.5 \times 10^{-3}$ atm or more.

(55) The method for producing a GaN crystal according to (51), (52) or (54) above, wherein in the growth step, a product of partial pressures of $GaCl_3$ and $NH_3$ supplied to the GaN seed crystal is $9.5 \times 10^{-5}$ atm$^2$ or more.

(56) The method for producing a GaN crystal according to any one of (51) to (55) above, wherein in the growth step, a GaN crystal comprising a portion where an FWHM of a (100) plane X-ray rocking curve is less than 100 arcsec is formed on the {10-10} surface.

(57) The method for producing a GaN crystal according to any one of (51) to (56) above, wherein the $GaCl_3$ is generated by reacting metal Ga and $Cl_2$ with each other to produce GaCl and reacting the produced GaCl with $Cl_2$.

(58) The method for producing a GaN crystal according to any one of (51) to (57) above, wherein in the growth step, GaN is grown at a growth temperature of 1200° C. or more.

(59) A method for producing a GaN wafer, comprising: producing a GaN crystal by the method for producing a GaN crystal according to any one of (51) to (58) above; and subsequently processing the produced GaN crystal to form at least one GaN wafer.

The present inventors tried SAG (Selective Area Growth) of GaN on a polar or non-polar GaN surface using $GaCl_3$ and $NH_3$ as raw materials and thereby found out that the SAG is feasible and that a GaN island having a particular shape is formed in the initial stage of the SAG. Another aspect of the present invention has been made based on such findings.

The embodiments of the present invention further include the following.

(60) A method for producing a GaN crystal, comprising: (i) a seed crystal preparation step of preparing a GaN seed crystal having a polar surface whose normal direction forms an angle of not less than 175° and not more than 180° with a [0001] direction of the GaN seed crystal; and (ii) a growth step of growing a GaN crystal comprising a hexagonal prism portion with {10-10} facets as side surfaces, from vapor phase on a surface comprising the polar surface of the GaN seed crystal using $GaCl_3$ and $NH_3$ as raw materials.

(61) The method for producing a GaN crystal according to (60) above, wherein the hexagonal prism portion terminates with a (000-1) facet.

(62) The method for producing a GaN crystal according to (61) above, wherein the hexagonal prism portion has a {10-1-1} facet as a chamfer between the (000-1) facet and each of the {10-10} facets.

(63) The method for producing a GaN crystal according to any one of (60) to (62) above, wherein the GaN seed crystal is at least part of a GaN substrate, and the polar surface is a main surface of the GaN substrate.

(64) The method for producing a GaN crystal according to (63) above, wherein the GaN substrate is a GaN single crystal substrate.

(65) The method for producing a GaN crystal according to (63) above, wherein the GaN substrate is a template substrate having a base substrate and a GaN single crystal layer grown on the base substrate.

(66) The method for producing a GaN crystal according to (63) above, wherein the GaN substrate is a GaN layer-bonded substrate having a base substrate and a GaN single crystal layer bonded to the base substrate.

(67) The method for producing a GaN crystal according to any one of (63) to (66) above, wherein in the growth step, a bulk GaN crystal having a maximum growth height of 300 µm or more on the polar surface is grown.

(68) The method for producing a GaN crystal according to (67) above, wherein the maximum growth height of the bulk GaN crystal is 300 µm or more and less than 500 µm, 500 µm or more and less than 1 mm, 1 mm or more and less than 3 mm, 3 mm or more and less than 5 mm, 5 mm or more and less than 10 mm, 10 mm or more and less than 25 mm, 25 mm or more and less than 50 mm, 50 mm or more and less than 75 mm, 75 mm or more and less than 100 mm, or 100 mm or more and less than 200 mm.

(69) A method for producing a GaN crystal, comprising a growth step of growing a GaN crystal comprising a hexagonal prism portion with {10-10} facets as side surfaces and having a growth end on a [000-1] side, from vapor phase using $GaCl_3$ and $NH_3$ as raw materials.

(70) The method for producing a GaN crystal according to (69) above, wherein the hexagonal prism portion terminates with a (000-1) facet.

(71) The method for producing a GaN crystal according to (70) above, wherein the hexagonal prism portion has a {10-1-1} facet as a chamfer between the (000-1) facet and each of the {10-10} facets.

(72) The method for producing a GaN crystal according to any one of (69) to (71) above, wherein in the growth step, the GaN crystal is grown on a three-dimensionally shaped GaN seed crystal.

(73) The method for producing a GaN crystal according to (72) above, wherein the three-dimensionally shaped GaN seed crystal has a hexagonal pyramid portion with {10-1-1} facets as side surfaces.

(74) The method for producing a GaN crystal according to (73) above, wherein the three-dimensionally shaped GaN seed crystal has a hexagonal prism portion arranged on a [0001] side of the hexagonal pyramid portion and having {10-10} facets as side surfaces.

(75) The method for producing a GaN crystal according to (72) above, wherein the three-dimensionally shaped GaN seed crystal has a hexagonal prism portion with {10-10} facets as side surfaces, and the hexagonal prism portion has a [000-1] side terminating with a (000-1) facet.

(76) The method for producing a GaN crystal according to (75) above, wherein the three-dimensionally shaped GaN seed crystal has a hexagonal prism portion with {10-10} facets as side surfaces and a truncated hexagonal pyramid portion arranged on the [000-1] side of the hexagonal prism portion and having a (000-1) facet as a top surface and {10-1-1} facets as side surfaces.

(77) The method for producing a GaN crystal according to (72) above, wherein the three-dimensionally shaped GaN seed crystal is shaped like a truncated hexagonal pyramid with a (000-1) facet as a top surface, a (0001) facet as a bottom surface, and {10-1-1} facets as side surfaces.

(78) The method for producing a GaN crystal according to any one of (72) to (77) above, wherein in the GaN seed crystal, a ratio of a size in a direction of a c-axis to a size in an arbitrary direction perpendicular to the c-axis is not less than 0.1 and not more than 10.

(79) The method for producing a GaN crystal according to (60) to (78) above, wherein in the growth step, growth of the GaN crystal is repeated intermittently.

(80) The method for producing a GaN crystal according to any one of (60) to (79) above, wherein the $GaCl_3$ is generated by reacting metal Ga and $Cl_2$ with each other to produce GaCl and reacting the produced GaCl with $Cl_2$.

(81) The method for producing a GaN crystal according to any one of (60) to (80) above, wherein in the growth step, a GaN is grown at a growth temperature of 1200° C. or more.

(82) A method for producing a GaN wafer, including: a crystal production step of producing a GaN crystal by the method for producing a GaN crystal according to any one of (60) to (81) above; and a crystal processing step of processing the GaN crystal produced in the crystal production step to form at least one GaN wafer.

(83) The method for producing a GaN wafer according to (82) above, wherein the GaN wafer formed in the crystal processing step includes a GaN wafer selected from a {10-10} wafer, a {30-3-1} wafer, a {20-2-1} wafer, a {30-3-2} wafer, a {10-1-1} wafer, a {30-31} wafer, a {20-21} wafer, a {30-32} wafer, a {10-11} wafer, a (0001) wafer, and a (000-1) wafer.

Further, still another aspect of the present invention relates to when a GaN substrate surface has a particular semi-polar surface, and the embodiments of the present invention further include the following.

(84) A method for producing a GaN crystal, comprising: (i) a seed crystal preparation step of preparing a GaN seed crystal having a semi-polar surface, a low-index orientation of the GaN seed crystal parallel or nearest parallel to a normal direction of the semi-polar surface being <10-1-1>; and (ii) a growth step of growing GaN from vapor phase on a surface including the semi-polar surface of the GaN seed crystal using $GaCl_3$ and $NH_3$ as raw materials.

(85) The method for producing a GaN crystal according to (84) above, wherein the normal direction of the semi-polar surface forms an angle of 5° or less with <10-1-1> of the GaN seed crystal.

(86) The method for producing a GaN crystal according to (84) above, wherein the semi-polar surface is a {10-1-1} surface.

(87) The method for producing a GaN crystal according to any one of (84) to (86) above, wherein the GaN seed crystal is a GaN {10-1-1} wafer.

(88) The method for producing a GaN crystal according to any one of (84) to (87) above, wherein in the growth step, GaN is grown on the semi-polar surface at a growth rate of 1 μm/h or more.

(89) The method for producing a GaN crystal according to any one of (84) to (88) above, wherein in the growth step, $GaCl_3$ is supplied to the GaN seed crystal at a partial pressure of $1.5\times10^{-3}$ atm or more.

(90) The method for producing a GaN crystal according to any one of (84) to (89) above, wherein in the growth step, a product of partial pressures of $GaCl_3$ and $NH_3$ supplied to the GaN seed crystal is $9.5\times10^{-5}$ $atm^2$ or more.

(91) The method for producing a GaN crystal according to any one of (84) to (87) above, wherein in the growth step, a GaN crystal comprising a portion where an FWHM of a (101) plane X-ray rocking curve is less than 50 arcsec is formed on the semi-polar surface.

(92) The method for producing a GaN crystal according to any one of (84) to (87) above, wherein in the growth step, a GaN crystal comprising a portion where an FWHM of a (202) plane X-ray rocking curve is less than 30 arcsec is formed on the semi-polar surface.

(93) The method for producing a GaN crystal according to (92) above, wherein in the growth step, a GaN crystal comprising a portion where an FWHM of a (202) plane X-ray rocking curve is less than 20 arcsec is formed on the semi-polar surface.

(94) The method for producing a GaN crystal according to (91) above, wherein in the growth step, GaN is grown on the semi-polar surface at a growth rate of 50 μm/h or more.

(95) The method for producing a GaN crystal according to (94) above, wherein in the growth step, GaN is grown on the semi-polar surface at a growth rate of 100 μm/h or more.

(96) The method for producing a GaN crystal according to (92) or (93) above, wherein in the growth step, GaN is grown on the semi-polar surface at a growth rate of 200 μm/h or more.

(97) The method for producing a GaN crystal according to (87) above, wherein in the growth step, a bulk GaN crystal having a maximum growth height of 300 μm or more on the semi-polar surface is grown.

(98) The method for producing a GaN crystal according to (97) above, wherein the maximum growth height of the bulk GaN crystal is 300 μm or more and less than 500 μm, 500 μm or more and less than 1 mm, 1 mm or more and less than 3 mm, 3 mm or more and less than 5 mm, 5 mm or more and less than 10 mm, 10 mm or more and less than 25 mm, 25 mm or more and less than 50 mm, 50 mm or more and less than 75 mm, 75 mm or more and less than 100 mm, or 100 mm or more and less than 200 mm.

(99) A method for producing a GaN crystal, comprising: (i) a seed crystal preparation step of preparing a GaN seed crystal having a {10-1-1} facet; and (ii) a growth step of growing GaN from vapor phase on a surface comprising the {10-1-1} facet of the GaN seed crystal using $GaCl_3$ and $NH_3$ as raw materials.

(100) The method for producing a GaN crystal according to (99) above, wherein in the GaN seed crystal, a ratio of a size in a direction of a c-axis to a size in an arbitrary direction perpendicular to the c-axis is not less than 0.1 and not more than 10.

(101) The method for producing a GaN crystal according to (99) or (100) above, wherein the {10-1-1} facet is an as-grown surface.

(102) The method for producing a GaN crystal according to any one of (99) to (101) above, wherein the GaN seed crystal further has a (000-1) facet.

(103) The method for producing a GaN crystal according to (102) above, wherein in the growth step, GaN is also grown on the (000-1) facet.

(104) The method for producing a GaN crystal according to any one of (99) to (103) above, wherein the GaN seed crystal has no {10-10} facet.

(105) The method for producing a GaN crystal according to any one of (99) to (104) above, wherein in the growth step, GaN is grown on the {10-1-1} facet at a growth rate of 1 μm/h or more.

(106) The method for producing a GaN crystal according to any one of (99) to (105) above, wherein in the growth step, $GaCl_3$ is supplied to the GaN seed crystal at a partial pressure of $1.5 \times 10^{-3}$ atm or more.

(107) The method for producing a GaN crystal according to any one of (99) to (106) above, wherein in the growth step, a product of partial pressures of $GaCl_3$ and $NH_3$ supplied to the GaN seed crystal is $9.5 \times 10^{-5}$ $atm^2$ or more.

(108) The method for producing a GaN crystal according to any one of (99) to (107) above, wherein in the growth step, a GaN crystal comprising a portion where an FWHM of a (202) plane X-ray rocking curve is less than 30 arcsec is formed on the {10-1-1} facet.

(109) The method for producing a GaN crystal according to (108) above, wherein in the growth step, a GaN crystal comprising a portion where an FWHM of a (202) plane X-ray rocking curve is less than 20 arcsec is formed on the {10-1-1} facet.

(110) The method for producing a GaN crystal according to any one of (84) to (109) above, wherein in the growth step, growth of GaN is repeated intermittently.

(111) The method for producing a GaN crystal according to any one of (84) to (110) above, wherein in the growth step, the $GaCl_3$ is generated by reacting metal Ga and $Cl_2$ with each other to produce GaCl and reacting the produced GaCl with $Cl_2$.

(112) The method for producing a GaN crystal according to any one of (84) to (111) above, wherein in the growth step, GaN is grown at a growth temperature of 1200° C. or more.

(113) A method for producing a GaN wafer, including: a crystal production step of producing a GaN crystal by the method for producing a GaN crystal according to any one of (84) to (112) above; and a crystal processing step of processing the GaN crystal produced in the crystal production step to form at least one GaN wafer.

(114) The method for producing a GaN wafer according to (113) above, wherein the GaN wafer formed in the crystal processing step includes a GaN wafer selected from a {10-10} wafer, a {30-3-1} wafer, a {20-2-1} wafer, a {30-3-2} wafer, a {10-1-1} wafer, a {30-31} wafer, a {20-21} wafer, a {30-32} wafer, a {10-11} wafer, a (0001) wafer, and a (000-1) wafer.

Still further, the embodiments of the present invention further include the following.

(115) A method for producing a GaN crystal, including: (i) a GaN seed crystal preparation step of preparing a GaN seed crystal having a main surface whose normal direction forms an angle of not less than 85° and not more than 180° with a [0001] direction of the GaN seed crystal and a pattern mask arranged on the main surface; and (ii) a SAG (Selective Area Growth) step of growing GaN from vapor phase on the main surface of the GaN seed crystal through the pattern mask using $GaCl_3$ and $NH_3$ as raw materials.

(116) The production method according to (115) above, wherein the pattern mask comprises an amorphous inorganic thin film.

(117) The production method according to (116) above, wherein the amorphous inorganic thin film comprises a silicon compound.

(118) The production method according to (117) above, wherein the amorphous inorganic thin film comprises $SiN_x$.

(119) The production method according to any one of (115) to (118) above, wherein the pattern mask has a dot-shaped opening, and in the SAG step, a GaN island is formed over the dot-shaped opening.

(120) The production method according to (119) above, wherein the pattern mask has a plurality of dot-shaped openings comprising a first dot-shaped opening and a second dot-shaped opening, and in the SAG step, a GaN island is formed over each of the first dot-shaped opening and the second dot-shaped opening.

(121) The production method according to (120) above, wherein in the SAG step, the GaN island formed over the first dot-shaped opening and the GaN island formed over the second dot-shaped opening are further allowed to coalesce with each other.

(122) The production method according to any one of (115) to (121) above, wherein in the SAG step, growth of GaN is continued until a GaN layer covering the main surface is formed.

(123) The production method according to any one of (115) to (122) above, wherein in the SAG step, $GaCl_3$ is supplied to the GaN seed crystal at a partial pressure of $1.5 \times 10^{-3}$ atm or more.

(124) The production method according to any one of (115) to (122) above, wherein in the SAG step, a product of partial pressures of $GaCl_3$ and $NH_3$ supplied to the GaN seed crystal is $9.5 \times 10^{-5}$ $atm^2$ or more.

(125) The production method according to any one of (115) to (124) above, wherein the GaN seed crystal is at least part of a GaN substrate.

(126) The production method according to (125) above, wherein the GaN substrate is a GaN single crystal substrate.

(127) The production method according to any one of (115) to (126) above, wherein a normal direction of the main surface forms an angle of 175° or more with a [0001] direction of the GaN seed crystal.

(128) A method for producing a GaN crystal, comprising: (i) a GaN seed crystal preparation step of preparing a GaN seed crystal having a polar surface whose normal direction forms an angle of not less than 175° and not more than 180° with a [0001] direction of the GaN seed crystal and a pattern mask arranged on the polar surface and provided with a dot-shaped opening; and (ii) a SAG (Selective Area Growth) step of growing GaN from vapor phase on the polar surface of the GaN seed crystal through the pattern mask using $GaCl_3$ and $NH_3$ as raw materials, the SAG step including forming a GaN island comprising a hexagonal prism portion over the dot-shaped opening.

(129) The production method according to (128) above, wherein the hexagonal prism portion has {10-10} facets as side surfaces.

(130) The production method according to (129) above, wherein the hexagonal prism portion terminates with a (000-1) facet.

(131) The production method according to (130) above, wherein the hexagonal prism portion has a {10-1-1} facet as a chamfer between the (000-1) facet and each of the {10-10} facets.

(132) The production method according to any one of (128) to (131) above, wherein the GaN seed crystal is at least part of a GaN substrate.

(133) The production method according to (132) above, wherein the GaN seed crystal is a GaN single crystal substrate.

(134) The production method according to (133) above, wherein the GaN single crystal substrate is an off-cut (000-1) wafer.

(135) The production method according to any one of (128) to (134) above, wherein the pattern mask comprises an amorphous inorganic thin film.

(136) The production method according to (135) above, wherein the amorphous inorganic thin film comprises a silicon compound.

(137) The production method according to (136) above, wherein the amorphous inorganic thin film comprises $SiN_x$.

(138) The production method according to any one of (128) to (137) above, wherein in the SAG step, $GaCl_3$ is supplied to the GaN seed crystal at a partial pressure of $1.5 \times 10^{-3}$ atm or more.

(139) The production method according to any one of (128) to (138) above, wherein in the SAG step, a product of partial pressures of $GaCl_3$ and $NH_3$ supplied to the GaN seed crystal is $9.5 \times 10^{-5}$ $atm^2$ or more.

Effect of the Invention

According to one embodiment of the present invention, a novel method for producing a GaN crystal is provided, the method comprising growing GaN from vapor phase on a semi-polar or non-polar GaN surface using $GaCl_3$ and $NH_3$ as raw materials.

According to another embodiment of the present invention, a novel method for producing a GaN crystal is provided, the method comprising growing a GaN crystal having a particular shape from vapor phase using $GaCl_3$ and $NH_3$ as raw materials.

DESCRIPTION OF EMBODIMENTS

GaN has a wurtzite-type crystal structure belonging to a hexagonal system. In GaN, a crystal axis parallel to [0001] and [000-1] is referred to as a c-axis, a crystal axis parallel to <10-10> is referred to an m-axis, and a crystal axis parallel to <11-20> is referred to an a-axis. A crystal plane perpendicular to the c-axis is referred to as a C-plane, a crystal plane perpendicular to the m-axis is referred to as a M-plane, and a crystal plane perpendicular to the a-axis is referred to as an A-plane.

GaN surfaces perpendicular to the c-axis include a (0001) surface (gallium polar surface) and a (000-1) surface (nitrogen polar surface). Such surfaces are also referred to as polar surfaces.

A GaN surface parallel to the c-axis, that is, a GaN surface for which 1 of Miller indices {hkil} is 0 (zero) such as a {10-10} surface and a {11-20} surface, is referred to as a non-polar surface.

A GaN crystal surface which is neither a polar surface nor a non-polar surface is referred to as a semi-polar surface.

In the present specification, unless otherwise noted, reference made to a crystal axis, a crystal surface, a crystal orientation, and the like means a crystal axis, a crystal surface, a crystal orientation, and the like of GaN.

1. Method for Producing GaN Crystal

Figure 1:
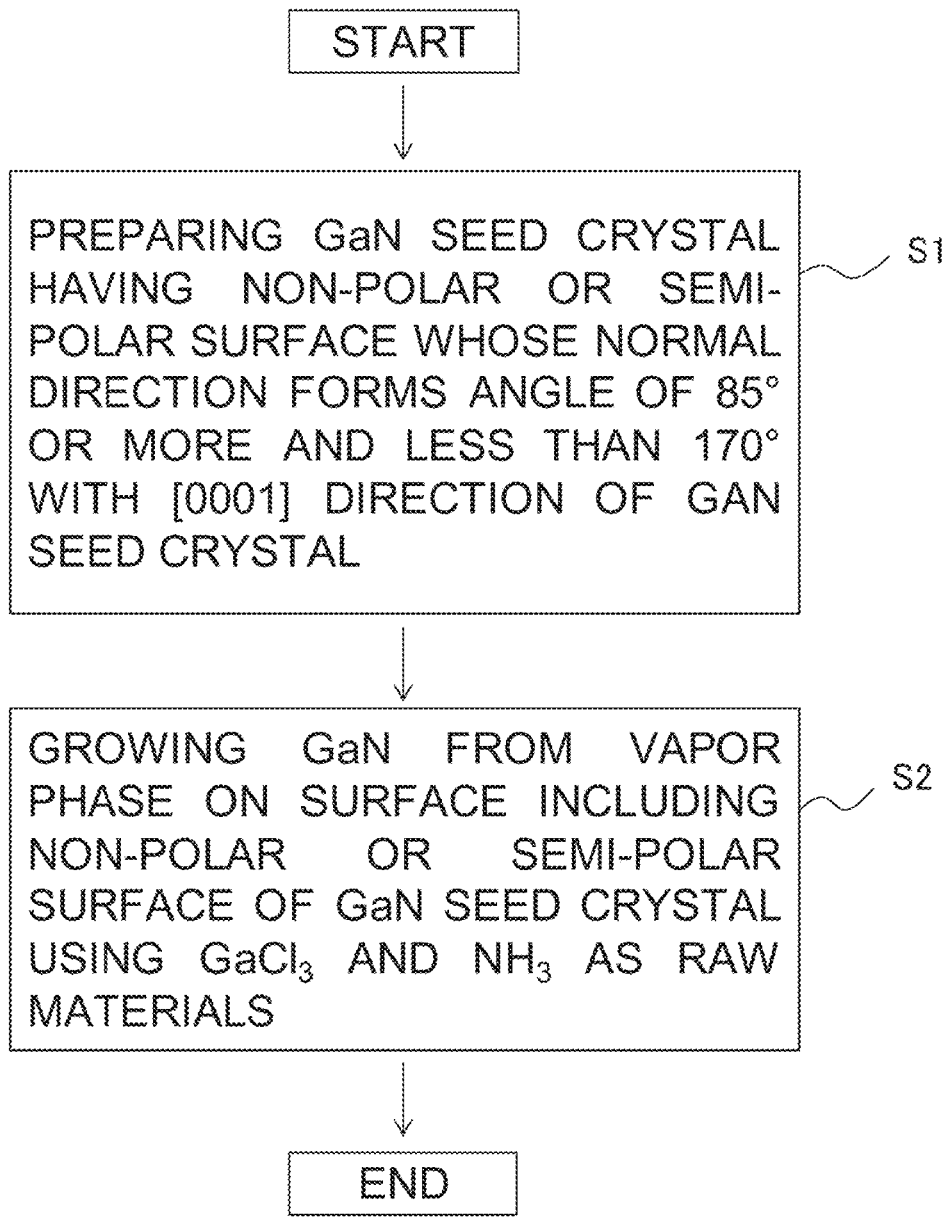
FIG. 1 shows a flow chart of a GaN crystal production method according to the embodiments.

As shown in a flow chart in FIG. 1, the GaN crystal production method according to the embodiments comprises the following two steps.

(S1) A seed crystal preparation step of preparing a GaN seed crystal comprising a non-polar or semi-polar surface whose normal direction forms an angle of 85° or more and less than 170° with the [0001] direction of the GaN seed crystal. (S2) A growth step of growing GaN from vapor phase using $GaCl_3$ and $NH_3$ as raw materials on a surface including the non-polar or semi-polar surface of the GaN seed crystal prepared in the seed crystal preparation step.

The GaN seed crystal prepared in the above-described seed crystal preparation step (S1) may have two or more non-polar or semi-polar surfaces, in which case, it is only necessary to satisfy a condition that at least one of the two or more non-polar or semi-polar surfaces has a normal direction forming an angle of 85° or more and less than 170° with the [0001] direction of the GaN seed crystal.

The GaN crystal production method according to the embodiments may further comprise another step in addition to the seed crystal preparation step and the growth step described above.

Hereinafter, more detailed description will be given with reference to drawings.

1.1. GaN Seed Crystal

[1] GaN Substrate

The GaN crystal production method according to the embodiments uses a GaN seed crystal. The GaN seed crystal may be a GaN substrate or a part of a GaN substrate.

Figure 2:
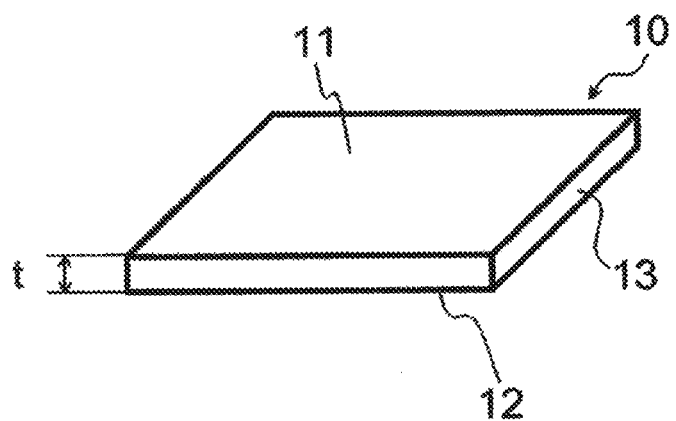
FIG. 2 is a perspective view illustrating one example of a GaN substrate which is usable in the GaN crystal production method according to the embodiments.

FIG. 2 is a perspective view illustrating one example of a GaN substrate which is usable as the seed crystal in the GaN crystal production method according to the embodiments. Referring to FIG. 2, a GaN substrate 10 has a first main surface 11 which is a main surface on one side and a second main surface 12 which is a main surface on the opposite side. The first main surface and the second main surface are connected to each other via a side surface 13.

Although the first main surface 11 and the second main surface 12 of the GaN substrate 10 are rectangular, they are not limited thereto and may be circular, hexagonal, or in any other shape. Usually, the first main surface 11 and the second main surface 12 are parallel to each other.

The first main surface 11 usually has an area of 1 $cm^2$ or more, preferably 2 $cm^2$ or more, more preferably 4 $cm^2$ or more, more preferably 10 $cm^2$ or more. The first main surface 11 may have an area of 10 $cm^2$ or more and less than 40 $cm^2$, 40 $cm^2$ or more and less than 60 $cm^2$, 60 $cm^2$ or more and less than 120 $cm^2$, 120 $cm^2$ or more and less than 180 $cm^2$, or 180 $cm^2$ or more.

The GaN substrate 10 usually has a thickness t of 200 μm or more, preferably 250 μm or more, more preferably 300 μm or more or may be made thicker depending on the area of the first main surface 11.

At least a portion including the first main surface 11 in the GaN substrate 10 is formed of a GaN single crystal. In other words, the first main surface 11 is a surface of a GaN single crystal.

Figure 3:
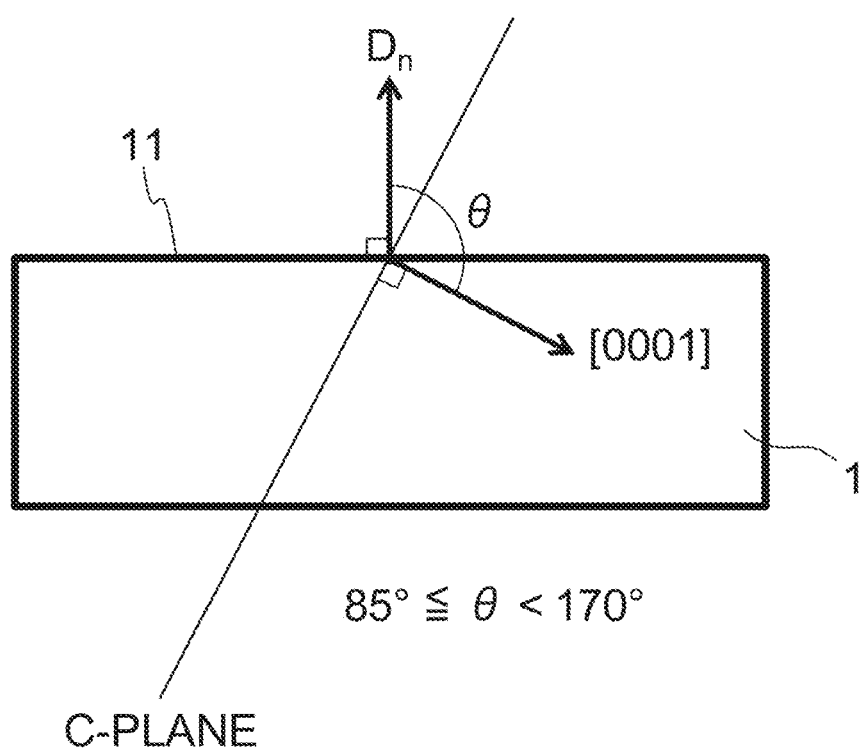
FIG. 3 illustrates a GaN single crystal having a first main surface as a surface when viewed from a direction parallel to an intersection line between the C-plane of the GaN single crystal and the first main surface.

FIG. 3 illustrates a GaN single crystal 1 which makes up a portion including the first main surface 11 in the GaN substrate 10 when viewed from a direction parallel to the intersection line between the C-plane of the GaN single crystal 1 and the first main surface. The first main surface 11 is a surface of the GaN single crystal 1. In FIG. 3, the intersection line between the C-plane of the GaN single crystal 1 and the first main surface 11 is perpendicular to the plane of paper.

The first main surface 11 has a normal direction Dn forming an angle θ with the [0001] direction of the GaN single crystal 1. The angle θ is 85° or more and less than 170°. The angle θ may be, for example, 85° or more and less than 90°, 90° or more and less than 93°, 93° or more and less than 97°, 97° or more and less than 102°, 102° or more and less than 107°, 107° or more and less than 112°, 112° or more and less than 122°, or 122° or more and less than 132°.

In a preferred example, the angle θ formed by the normal direction Dn of the first main surface 11 with the [0001] direction of the GaN single crystal 1 is 87° or less or 93° or more. This is because if the angle θ is within a range of 90°±approximately 2°, when GaN is epitaxially grown on the first main surface during the growth step which will be described later, a GaN crystal having a relatively low quality tends to be formed.

The normal direction Dn of the first main surface 11 and the [0001] direction of the GaN single crystal 1 are in such a relationship that the former overlaps the latter when the former is rotated around the intersection line between the C-plane of the GaN single crystal 1 and the first main surface 11 as a rotation axis.

The direction of the intersection line is not limited, but is preferably in the a-axis direction±15°, more preferably in the a-axis direction±5°, more preferably in the a-axis direction±3°, more preferably in the a-axis direction±2°, more preferably in the a-axis direction±1°.

In a preferred example, the low-index orientation of the GaN single crystal 1 parallel or nearest parallel to the normal direction of the first main surface 11 may be <10-10>, <30-3-1>, <20-2-1>, <30-3-2> or <10-1-1>.

Herein, a crystal orientation for which all of the absolute values of integers h, k, i, and l of Miller indices <hkil> are smaller than or equal to 3 is referred to as a low-index orientation.

When the first main surface 11 has a normal direction parallel to <10-10> of the GaN single crystal 1, an angle formed between the normal direction and the [0001] direction of the GaN single crystal 1 is 90°, and the intersection line between the first main surface 11 and the C-plane of the GaN single crystal 1 extends in the a-axis direction.

When the first main surface 11 has a normal direction parallel to <30-3-1> of the GaN single crystal 1, an angle formed between the normal direction and the [0001] direction of the GaN single crystal 1 is 100.1°, and the intersection line between the first main surface 11 and the C-plane of the GaN single crystal 1 extends in the a-axis direction.

When the first main surface 11 has a normal direction parallel to <20-2-1> of the GaN single crystal 1, an angle formed between the normal direction and the [0001] direction of the GaN single crystal 1 is 104.9°, and the intersection line between the first main surface 11 and the C-plane of the GaN single crystal 1 extends in the a-axis direction.

When the first main surface 11 has a normal direction parallel to <30-3-2> of the GaN single crystal 1, an angle formed between the normal direction and the [0001] direction of the GaN single crystal 1 is 109.5°, and the intersection line between the first main surface 11 and the C-plane of the GaN single crystal 1 extends in the a-axis direction.

When the first main surface 11 has a normal direction parallel to <10-1-1> of the GaN single crystal 1, an angle formed between the normal direction and the [0001] direction of the GaN single crystal 1 is 118°, and the intersection line between the first main surface 11 and the C-plane of the GaN single crystal 1 extends in the a-axis direction.

When the first main surface 11 has a normal direction parallel to <20-2-3> of the GaN single crystal 1, an angle formed between the normal direction and the [0001] direction of the GaN single crystal 1 is 128.6°, and the intersection line between the first main surface 11 and the C-plane of the GaN single crystal 1 extends in the a-axis direction.

Preferably, the GaN substrate 10 is a GaN single crystal substrate.

It is known that bulk GaN single crystals grown by various methods including an HVPE method, a flux method, and a sublimation method can be sliced in an arbitrary direction to thereby fabricate GaN single crystal substrates having various surface orientations. For example, WO2008/059875 discloses a large area non-polar or semi-polar GaN single crystal substrate which is cut out from a bulk GaN crystal grown on a plurality of rectangular substrates disposed adjoining each other.

The GaN substrate 10 may be a template substrate comprising a base substrate and a GaN single crystal layer epitaxially grown on the base substrate. In this case, the surface of the GaN single crystal layer corresponds to the first main surface 11.

Typically, the base substrate is a single crystal substrate (hetero substrate) made of a material differing in composition from GaN, such as a sapphire substrate, a spinel substrate, an AlN substrate, a SiC substrate, and a Si substrate. The epitaxial growth method may be a vapor phase growth method such as an MOVPE method and an HVPE method or may be a flux method.

The GaN substrate 10 may be a GaN layer-bonded substrate comprising a base substrate and a GaN single crystal layer bonded to the base substrate. In this case, the surface of the GaN single crystal layer corresponds to the first main surface 11.

GaN layer-bonded substrates are formed by a method comprising: bonding a bulk GaN single crystal to the base substrate; and subsequently cutting the bulk GaN single crystal such that a GaN single crystal layer is left on the base substrate side. The base substrate may be any of various single crystal substrates or may be a metal substrate, a ceramic substrate, a polycrystalline GaN substrate, or the like.

Preferably, the first main surface 11 of the GaN substrate 10 is a surface which has been planarized by mechanical polishing (such as grinding and lapping) and subsequently been subjected to finishing process including dry etching and/or CMP (Chemical Mechanical Polishing) so that crystal defects introduced by the mechanical polishing are removed.

In one example, the first main surface 11 of the GaN substrate 10 may be an as-grown GaN surface.

In one example, on the first main surface 11 of the GaN substrate 10, a pattern mask for causing SAG (Selective Area Growth) may be arranged. The material for the pattern mask is for example $SiN_x$. On a $SiN_x$ thin film, vapor phase growth of GaN from $GaCl_3$ and $NH_3$ is inhibited. Amorphous inorganic thin films made of other materials, for example a silicon oxide film or a silicon oxynitride film are also usable as a material for the pattern mask.

The pattern mask may be provided with an opening shaped like a dot, such as a circle or a regular polygon. The dot-shaped openings may be arranged for example in a closest packed manner. In the closest packed arrangement, each opening is arranged at a lattice position of a regular triangle lattice (a vertex of a regular triangle).

The pattern mask may be provided with a linear opening. Thus, the pattern mask may be a stripe mask.

[2] Three-Dimensionally Shaped GaN Seed Crystal

The GaN seed crystal used in the GaN crystal production method according to the embodiments may be a GaN crystal having a three-dimensional shape. Preferably, in the three-dimensionally shaped GaN seed crystal, the ratio of its size in the c-axis direction and its size in an arbitrary direction perpendicular to the c-axis is 0.1 or more and 10 or less. The ratio may be 0.2 or more, further may be 0.3 or more, and may be 5 or less, further may be 3 or less.

Examples of the shapes of the three-dimensionally shaped GaN seed crystals that are usable in the GaN crystal production method according to the embodiments are illustrated in FIGS. 4 to 9.

Figure 4:
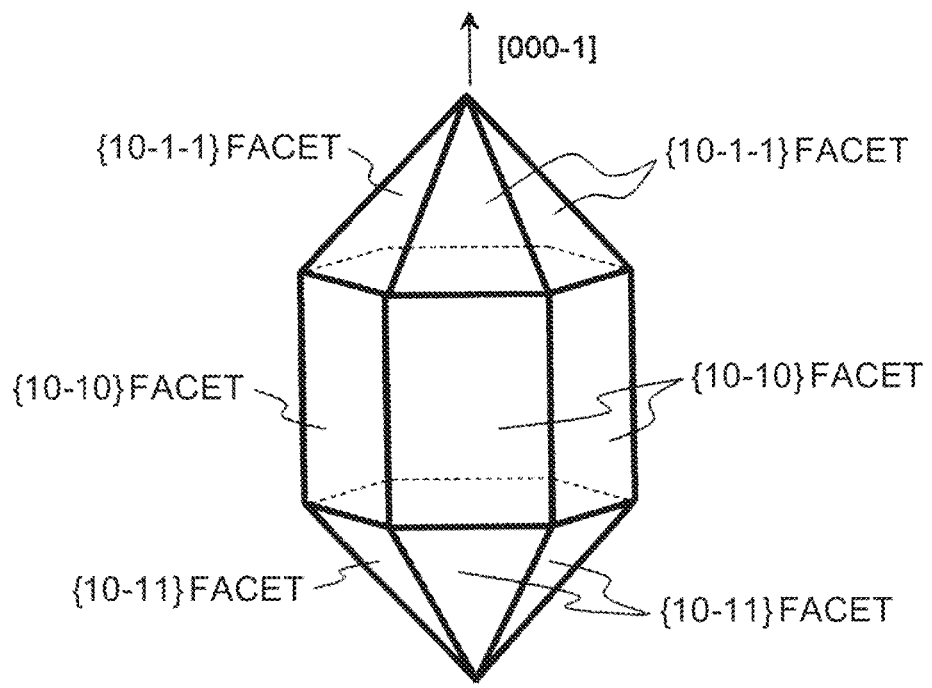
FIG. 4 is a perspective view illustrating an example of the shape of a GaN seed crystal.

FIG. 4 illustrates a GaN seed crystal which has a hexagonal prism portion with {10-10} facets as side surfaces, a first hexagonal pyramid portion with {10-1-1} facets as side surfaces, and a second hexagonal pyramid portion with {10-11} facets as side surfaces. The first hexagonal pyramid portions are arranged on the [000-1] side of the hexagonal prism portion, while the second hexagonal pyramid portions are on the [0001] side.

The GaN seed crystal illustrated in FIG. 4 can be produced by a liquid phase growth method such as a Na flux method and an ammonothermal method.

Figure 5:
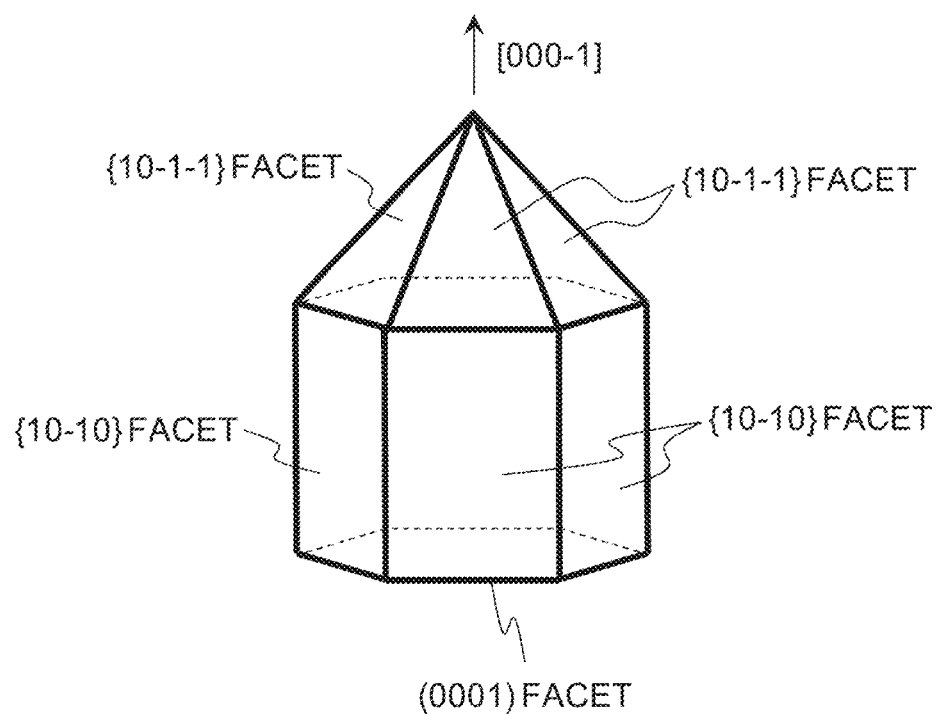
FIG. 5 is a perspective view illustrating an example of the shape of a GaN seed crystal.

FIG. 5 illustrates a GaN seed crystal which has a hexagonal prism portion with {10-10} facets as side surfaces and a hexagonal pyramid portion with {10-1-1} facets as side surfaces arranged on the [000-1] side of the hexagonal prism portion. The [0001] side of the hexagonal prism portion terminates with a (0001) facet.

The GaN seed crystal illustrated in FIG. 5 can be produced for example by removing, through cutting or polishing, the second hexagonal pyramid portion from the GaN seed crystal illustrated in FIG. 4.

Figure 6:
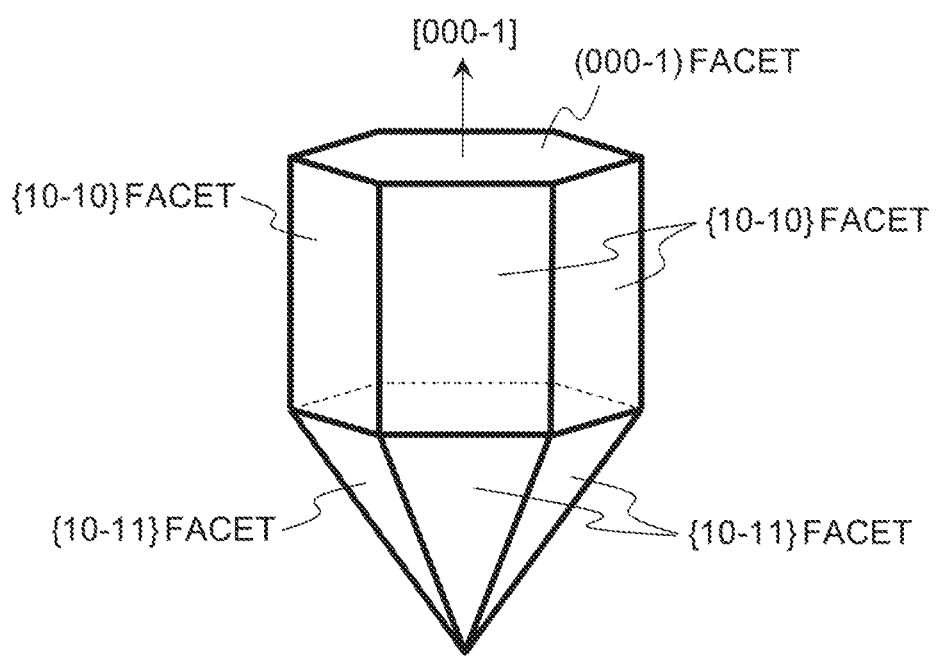
FIG. 6 is a perspective view illustrating an example of the shape of a GaN seed crystal.

FIG. 6 illustrates a GaN seed crystal which has a hexagonal prism portion with {10-10} facets as side surfaces and a hexagonal pyramid portion with {10-11} facets as side surfaces arranged on the [0001] side of the hexagonal prism portion. The [000-1] side of the hexagonal prism portion terminates with a (000-1) facet.

The GaN seed crystal illustrated in FIG. 6 can be produced for example by removing, through cutting or polishing, the first hexagonal pyramid portion from the GaN seed crystal illustrated in FIG. 4.

Figure 7:
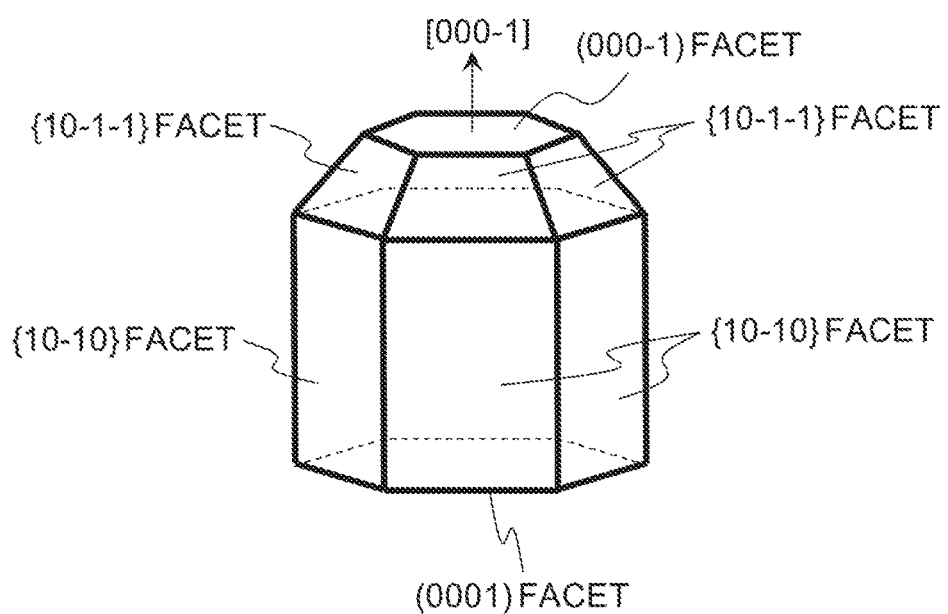
FIG. 7 is a perspective view illustrating an example of the shape of a GaN seed crystal.

FIG. 7 is a perspective view illustrating yet another example of the GaN seed crystal prepared in the seed crystal preparation step.

FIG. 7 illustrates a GaN seed crystal which has a hexagonal prism portion with {10-10} facets as side surfaces and a truncated hexagonal pyramid portion with a (000-1) facet as a top surface and {10-1-1} facets as side surfaces arranged on the [000-1] side of the hexagonal prism portion. The [0001] side of the hexagonal prism portion terminates with a (0001) facet.

The GaN seed crystal illustrated in FIG. 7 can be produced for example by a crystal growth method disclosed in JP-A-2013-212978.

Figure 8:
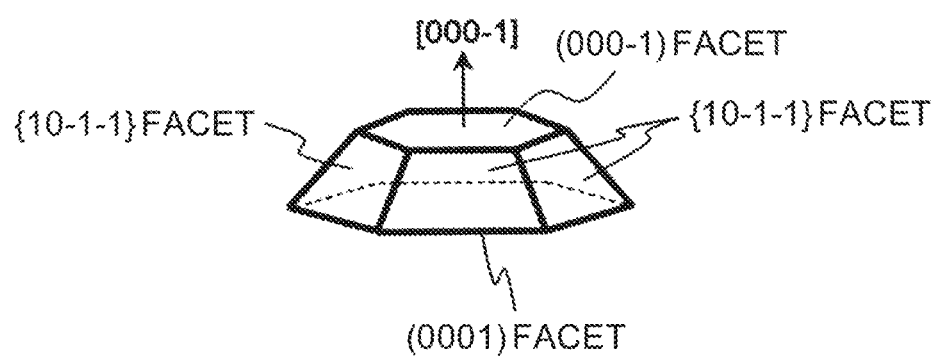
FIG. 8 is a perspective view illustrating an example of the shape of a GaN seed crystal.

FIG. 8 illustrates a GaN seed crystal which is shaped like a truncated hexagonal pyramid with a (000-1) facet as a top surface, a (0001) facet as a bottom surface, and {10-1-1} facets as side surfaces.

The GaN seed crystal illustrated in FIG. 8 can be produced for example by a crystal growth method disclosed in JP-A-2013-212978.

Figures 9A, 9B:
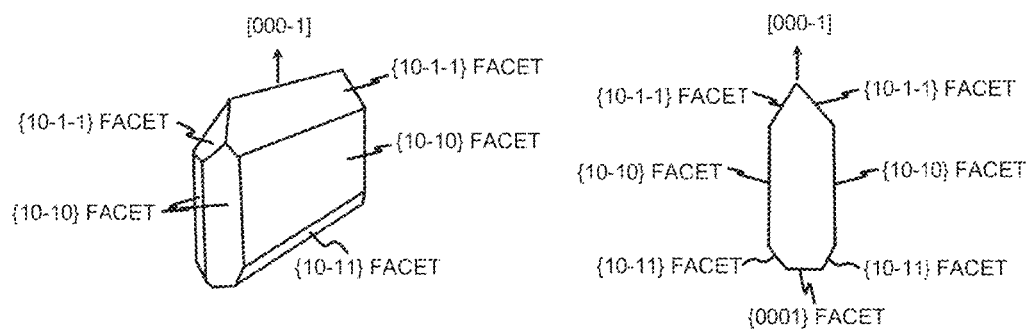
FIG. 9A is a perspective view illustrating an example of the shape of a GaN seed crystal.
FIG. 9B is a cross-sectional view illustrating an example of the shape of a GaN seed crystal.

FIGS. 9A and 9B illustrate a GaN seed crystal which can be produced by a crystal growth method disclosed in JP-A-2013-212978, and FIG. 9A is a perspective view while FIG. 9B is a cross-sectional view when cut along a plane perpendicular to the longitudinal direction of the crystal.

In the GaN seed crystals illustrated by examples in FIGS. 4 to 9B, {10-10} facets and {10-1-1} facets can be as-grown surfaces. Alternatively, these facets may be etched surfaces.

1.2. Vapor Phase Growth Apparatus

In the GaN crystal production method according to the embodiments, a vapor phase growth apparatus provided with a first zone, a second zone, and a growth zone can be preferably used for growing GaN from $GaCl_3$ and $NH_3$. In the first zone, $Cl_2$ and metal Ga react with each other to generate GaCl. In the second zone, GaCl generated in the first zone reacts with $Cl_2$ to generate $GaCl_3$. In the growth zone, $NH_3$ and gaseous gallium chloride including $GaCl_3$ react with each other to generate GaN which epitaxially grows on a GaN seed crystal.

Figure 10:
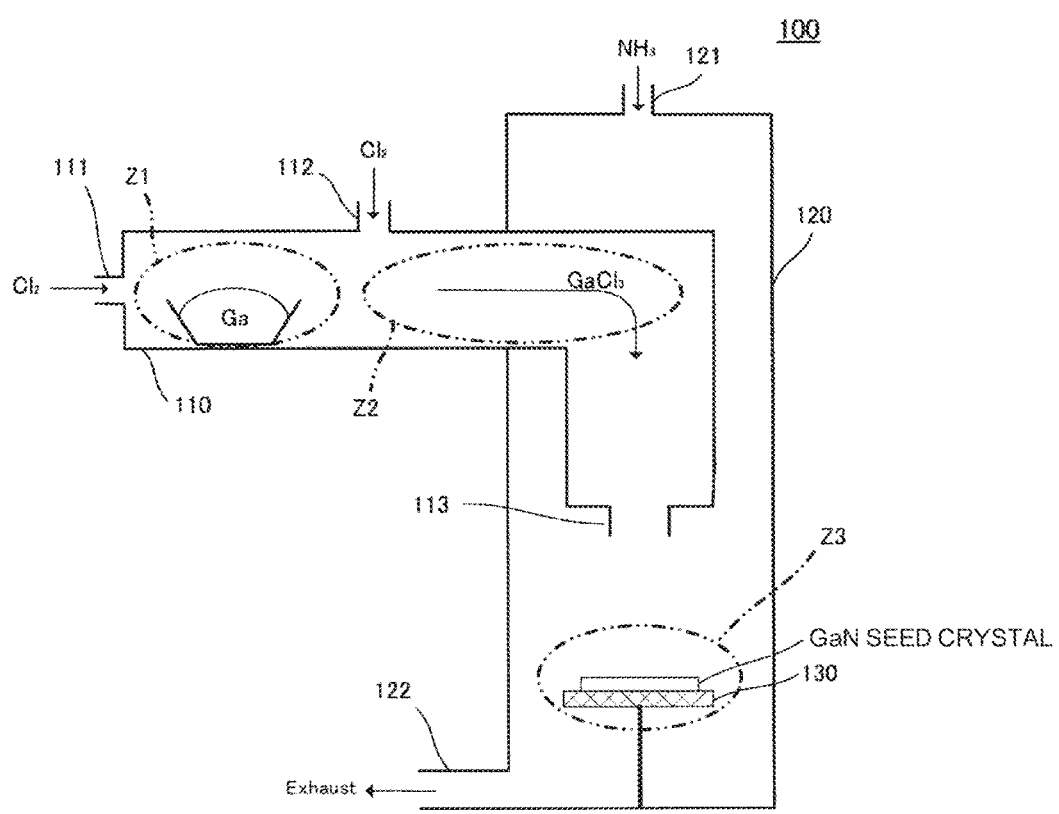
FIG. 10 is a schematic diagram of a crystal growth apparatus usable in the GaN crystal production method according to the embodiments.

One example of the above-described vapor phase growth apparatus having the first zone, the second zone, and the growth zone is schematically illustrated in FIG. 10.

Referring to FIG. 10, a vapor phase growth apparatus 100 has a first reaction tube 110 and a second reaction tube 120. A first zone Z1 and a second zone Z2 are provided in the first reaction tube 110, and a growth zone Z3 is provided in the second reaction tube 120.

The first reaction tube 110 and the second reaction tube 120 may be formed of, without limitation, quartz.

In the first zone Z1 in the first reaction tube 110, metal Ga is placed. A container for metal Ga is for example a quartz boat.

The first reaction tube 110 has a first $Cl_2$ supply port 111 provided upstream of the first zone Z1 and a second $Cl_2$ supply port 112 provided downstream of the first zone Z1. The second zone Z2 starts from the position of the second $Cl_2$ supply port 112 and extends downstream.

An external heater (not illustrated) is arranged outside the first reaction tube 110 such that the first zone Z1 and the second zone Z2 can be heated by the external heater independently from each other. Examples of the external heater include resistance heaters, induction heaters, and lamp heaters.

In the first zone Z1, $Cl_2$ introduced through the first $Cl_2$ supply port 111 reacts with metal Ga to generate gaseous gallium chloride. The main component of the gaseous gallium chloride is GaCl generated by the following reaction.

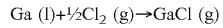

In the reaction formula above, each of (l), (s) and (g) denotes that the substance is a respective one of a liquid, a solid, and a gas (the same applies hereinafter).

In the second zone Z2, $Cl_2$ introduced through the second $Cl_2$ supply port 112 reacts with gaseous gallium chloride transported from the first zone Z1. The main reaction is a $GaCl_3$ generation reaction, which is as follows.

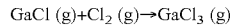

The first reaction tube 110 has a gas outlet 113 at a downstream end thereof. The first reaction tube 110 has a downstream portion which is inserted into the second reaction tube 120, and gallium chloride generated in the first reaction tube is transported through the gas outlet 113 into the second reaction tube 120.

The second reaction tube 120 has a $NH_3$ supply port 121 provided upstream of the growth zone Z3 and an exhaust port 122 provided downstream of the growth zone Z3. The gas outlet 113 of the first reaction tube 110 is positioned upstream of the growth zone Z3.

In the growth zone Z3, a susceptor 130 to put a GaN seed crystal on is placed. The susceptor 130 is formed of carbon, for example.

An external heater (not illustrated) for heating a GaN seed crystal placed on the susceptor 130 such that the GaN seed crystal is heated together with the susceptor is arranged outside the second reaction tube 120. Examples of the external heater include resistance heaters, induction heaters, and lamp heaters. In one example, instead of or in addition to the external heater, a resistance heater may be provided inside the susceptor 130.

In the growth zone Z3, $NH_3$ and gaseous gallium chloride including $GaCl_3$ react with each other to generate GaN. The generated GaN epitaxially grows on the GaN seed crystal.

Figure 11:
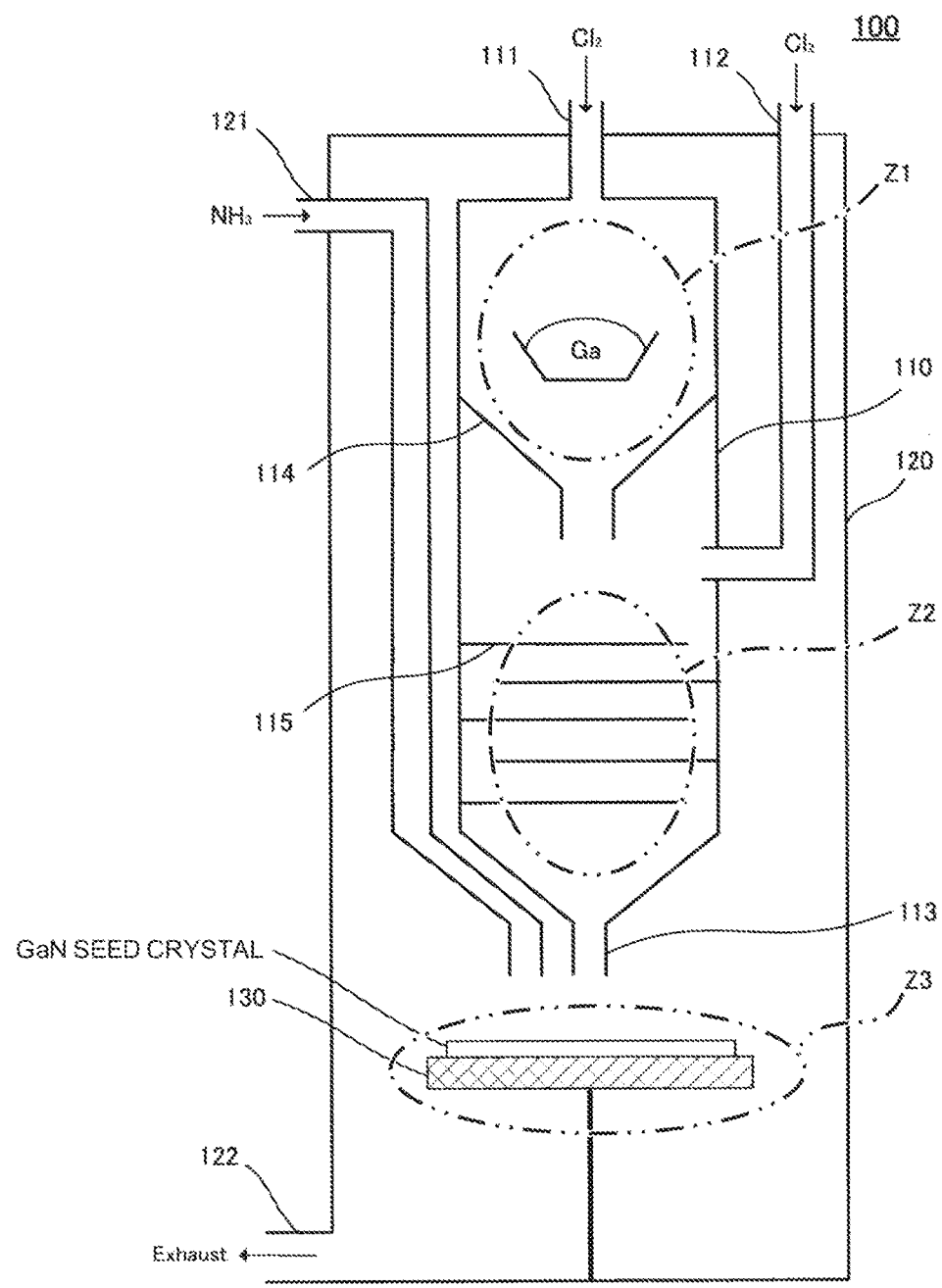
FIG. 11 is a schematic diagram of a crystal growth apparatus usable in the GaN crystal production method according to the embodiments.

The vapor phase growth apparatus used in the growth step may be variously modified while having the same basic configuration as that of the vapor phase growth apparatus illustrated in FIG. 10. One example of such modified vapor phase growth apparatuses is illustrated in FIG. 11. In FIG. 11, elements corresponding to the elements of the vapor phase growth apparatus illustrated in FIG. 10 are allotted with the same reference signs as those in FIG. 10.

In contrast with the apparatus in FIG. 10 in which the first reaction tube 110 is an L-shaped tube only whose downstream portion including the gas outlet 113 is inserted into the second reaction tube 120, in the apparatus in FIG. 11, the first reaction tube 110 is a straight tube whose entirety is placed in the second reaction tube 120.

The above is not the only difference between the apparatus in FIG. 11 and the apparatus in FIG. 10.

For example, the vapor phase growth apparatus 100 in FIG. 11 has a funnel-shaped tube 114 provided between the first zone Z1 and the second zone Z2 in the first reaction tube 110 for decreasing the cross-sectional area of the flow path gradually from the upstream side to the downstream side, with a view to increasing the flow path resistance on the downstream side to thereby increase $Cl_2$ partial pressure in the first zone Z1 and enhance the efficiency of GaCl generation in the zone.

Further, the vapor phase growth apparatus 100 in FIG. 11 has baffles 115 provided in the second zone Z2 with a view to improving the efficiency of $GaCl_3$ generation. Placement of the baffles causes extension of flow path length resulting in a longer period of time during which GaCl and $Cl_2$ stay in the second zone, and in addition causes gas flow disturbance which are expected to have an enhancing effect on mixing of GaCl and $Cl_2$.

In a preferred example, in each vapor phase growth apparatus 100 illustrated in FIGS. 10 and 11, the gas outlet 113 of the first reaction tube 110 may be structured as a double tube and configured to release gallium chloride gas through an inner tube and a barrier gas through an outer tube. This is to enclose a gallium chloride gas flow exiting from the gas outlet 113 within a barrier gas flow so as to prevent gallium chloride from reacting with $NH_3$ before reaching the growth zone Z3. Used as the barrier gas is an inert gas, specifically $N_2$ (nitrogen gas) or a noble gas (such as Ar).

In addition, in the vapor phase growth apparatus 100 of FIG. 10 or 11, the first reaction tube 110 and the second reaction tube 120 may be each provided suitably with a gas supply port dedicated for a carrier gas. Used as the carrier gas is an inert gas, specifically $N_2$ (nitrogen gas) or a noble gas (such as Ar).

In the vapor phase growth apparatus illustrated in FIG. 10, the L-shaped first reaction tube 110 may be arranged such that one of the linear portions is vertical and the other is horizontal, or may be arranged such that both of the linear portions are horizontal.

In the vapor phase growth apparatus illustrated in FIG. 11, the first reaction tube 110 and the second reaction tube 120 may extend either in a vertical direction or in a horizontal direction or may be tilted.

The vapor phase growth apparatus illustrated in FIG. 10 or 11 may be suitably provided with a mechanism for rotating the susceptor 130.

Although examples of the vapor phase growth apparatus preferably usable for vapor phase growth of GaN using $GaCl_3$ and $NH_3$ as raw materials have been described above, the vapor phase growth apparatus usable in the GaN crystal production method according to the embodiments is not limited by those described above. For instance, it is also possible to use a vapor phase growth apparatus of the type which vaporizes solid $GaCl_3$ to generate gaseous $GaCl_3$ as disclosed in Patent Document 1.

1.3. Vapor Phase Growth of GaN

Using the vapor phase growth apparatus 100 illustrated in FIG. 10 or 11, vapor phase growth of GaN can be achieved on a GaN seed crystal in accordance with the following procedure.

First, a GaN seed crystal is set on the susceptor 130 arranged in the second reaction tube 120.

A quartz boat containing metal gallium is placed in the first zone Z1 in the first reaction tube 110.

Next, a carrier gas is flown through the first reaction tube 110 and the second reaction tube 120 to make the inner atmospheres in these reaction tubes into carrier gas atmospheres. As previously described, an inert gas, specifically $N_2$ or a noble gas is used as the carrier gas. A barrier gas may also be allowed to start flowing at this timing.

The carrier gas may be introduced into the reaction tubes through the $Cl_2$ supply ports and/or the $NH_3$ supply port, and also may be introduced into the reaction tubes through supply ports dedicated for inert gasses and suitably provided in the reaction tubes.

Further, through the $NH_3$ supply port 121, supply of $NH_3$ into the second reaction tube 120 is started. When necessary, $NH_3$ is introduced into the second reaction tube 120 together with the carrier gas.

After starting supply of $NH_3$, the GaN seed crystal is heated to a predetermined growth temperature by using the external heater (not illustrated).

The growth temperature is usually 900° C. or higher. As shown in the experimental results to be described later, even at a growth temperature of 1200° C. or higher and further at a growth temperature of 1300° C. or higher, GaN is growable at a growth rate sufficient for practical uses.

While the growth temperature has no particular upper limit, in order to prevent the vapor phase growth apparatus from malfunctioning due to the thermal deterioration of parts including the reaction tubes, the growth temperature is preferably set to lower than 1500° C. and more preferably lower than 1400° C.

The pressure in the second reaction tube 120 (pressure in the growth zone) is regulated by an external exhauster (such as a fan) connected to the exhaust port 122 of the second reaction tube such that the pressure has a constant value, for example, within the range of from 0.8 to 1.2 atm.

By using the external heater (not illustrated), the first reaction tube is heated to reach a predetermined temperature before the GaN seed crystal reaches the predetermined growth temperature.

Setting the temperature of the first zone Z1 to 400° C. or higher makes it possible that gallium chloride species generated in the zone are mostly GaCl (see FIG. 5 of Patent Document 2).

From the viewpoint of increasing GaCl generation rate, the first zone Z1 is at a temperature of preferably 500° C. or more, more preferably 700° C. or more. From the viewpoint of preventing shorter life of the first reaction tube due to thermal deterioration, the first zone Z1 is at a temperature of preferably 1000° C. or less, more preferably 900° C. or less, more preferably 850° C. or less.

The second zone Z2 is heated at least to a temperature at which GaCl supplied from the first zone Z1 does not precipitate on the wall of the reaction tube.

Setting the temperature of the second zone Z2 to 200° C. or higher makes it possible that gallium chloride species generated in the zone are mostly $GaCl_3$ (see FIG. 6 of Patent Document 2).

The second zone Z2 may be at a temperature of less than 200° C., since gallium chloride species generated are mostly $GaCl_3$ or a dimer of gallium trichloride represented by $(GaCl_3)_2$. This dimer will change into $GaCl_3$ in the growth zone Z3 which is heated to a high temperature.

From the viewpoint of increasing $GaCl_3$ generation rate, the second zone Z2 is at a temperature of preferably 500° C. or more, more preferably 700° C. or more. From the viewpoint of preventing shorter life of the first reaction tube due to thermal deterioration, the second zone Z2 is at a temperature of preferably 1000° C. or less, more preferably 900° C. or less, more preferably 850° C. or less.

From the viewpoint of stabilizing the gas flow, it is preferable to set the temperature of the second zone Z2 to be equal to the temperature of the first zone Z1.

Once the GaN seed crystal reaches the predetermined growth temperature, $Cl_2$ is immediately supplied through each of the first $Cl_2$ supply port 111 and the second $Cl_2$ supply port 112 into the first reaction tube 110 to generated gallium chloride. $Cl_2$ is introduced into the first reaction tube 110 together with the carrier gas as necessary. Used as the carrier gas is an inert gas, specifically $N_2$ or a noble gas.

When the gallium chloride generated in the first reaction tube 110 reaches the growth zone in the second reaction tube 120, epitaxial growth of GaN starts on the GaN seed crystal.

The flow rate of $Cl_2$ supplied to the first reaction tube 110 and the flow rate of $NH_3$ supplied to the second reaction tube 120 are set such that the total pressure and the $Cl_2$ partial pressure in each of the first zone Z1 and the second zone Z2 and the total pressure, the $GaCl_3$ partial pressure, and the $NH_3$ partial pressure in the growth zone Z3, are each within a desired range.

In the first zone Z1, for example, the $Cl_2$ partial pressure is $1.0 \times 10^{-3}$ atm or higher, and the total pressure is from 0.8 to 1.2 atm.

In the second zone Z2, for example, the $Cl_2$ partial pressure is $2.0 \times 10^{-3}$ atm or higher, and the total pressure is from 0.8 to 1.2 atm.

In the growth zone Z3, for example, the $GaCl_3$ partial pressure is from $9.0 \times 10^{-3}$ to $1.0 \times 10^{-1}$ atm, the $NH_3$ partial pressure is from $5.0 \times 10^{-2}$ to $2.5 \times 10^{-1}$ atm, and the total pressure is from 0.8 to 1.2 atm.

The $GaCl_3$ partial pressure in the growth zone Z3 is in other words the partial pressure of $GaCl_3$ supplied to the GaN seed crystal.

The $GaCl_3$ partial pressure in the growth zone Z3 may be less than $9.0 \times 10^{-3}$ atm, and may be for example $1.5 \times 10^{-3}$ atm or more and less than $2.4 \times 10^{-3}$ atm, $2.4 \times 10^{-3}$ atm or more and less than $4.1 \times 10^{-3}$ atm, or $4.1 \times 10^{-3}$ atm or more and less than $9.0 \times 10^{-3}$ atm.

The growth rate of GaN is controllable by the partial pressures of $GaCl_3$ and $NH_3$ supplied to the GaN seed crystal. For instance, the product of the $GaCl_3$ partial pressure and the $NH_3$ partial pressure in the growth zone Z3 may be set to $9.5 \times 10^{-5}$ atm$^2$ or more and less than $3.2 \times 10^{-4}$ atm$^2$, $3.2 \times 10^{-4}$ atm$^2$ or more and less than $7.0 \times 10-4$ atm$^2$, $7.0 \times 10^{-4}$ atm$^2$ or more and less than $9.8 \times 10-4$ atm$^2$, or $9.8 \times 10^{-4}$ atm$^2$ or more.

When terminating the growth of GaN, the supply of $Cl_2$ to the first reaction tube 110 is stopped to thereby stop the supply of gallium chloride to the growth zone Z3. At the same time, heating of GaN seed crystal is stopped to allow the reaction tube temperature of the second reaction tube to drop to room temperature. To prevent the degradation of grown GaN, $NH_3$ and the carrier gas are flown through the second reaction tube 120 also during lowering the temperature.

Among surfaces of a GaN seed crystal, it is a surface whose normal direction forms an angle of not less than 85° and not more than 180° with the [0001] direction of the GaN seed crystal on which GaN can be grown from $GaCl_3$ and $NH_3$. The growth rate of GaN on such a surface may be 1 µm/h or more.

The growth rate may be set to, for example, 1 µm/h or more and less than 5 µm/h, 5 µm/h or more and less than 10 µm/h, 10 µm/h or more and less than 15 µm/h, 15 µm/h or more and less than 20 µm/h, 20 µm/h or more and less than 25 µm/h, 25 µm/h or more and less than 50 µm/h, 50 µm/h or more and less than 75 µm/h, 75 µm/h or more and less than 100 µm/h, 100 µm/h or more and less than 125 µm/h, 125 µm/h or more and less than 150 µm/h, 150 µm/h or more and less than 175 µm/h, 175 µm/h or more and less than 200 µm/h, 200 µm/h or more and less than 250 µm/h, 250 µm/h or more and less than 300 µm/h, 300 µm/h or more and less than 400 µm/h, 400 µm/h or more and less than 500 µm/h, or 500 µm/h or more and less than 2000 µm/h.

A growth rate of GaN on a certain GaN surface can be examined by growing a GaN crystal layer on the GaN surface and dividing the thickness of the grown GaN crystal layer by the growth time.

When using a crystal growth apparatus of the type illustrated in FIG. 10 or FIG. 11, the growth time may be a period of time between the start of $Cl_2$ supply to the first reaction tube and the stop of the $Cl_2$ supply. When using other types of crystal growth apparatuses, the reaction time may be a period of time between the start of $GaCl_3$ supply to a growth chamber and the stop of the supply.

As a general tendency, the lower the growth rate is, the better the crystallinity of the grown GaN crystal is. Thus, GaN has a growth rate of preferably less than 150 µm/h, more preferably less than 125 µm/h.

An exception is when a GaN crystal is grown on the {10-1-1} surface of GaN, in which case it is possible that a GaN crystal grown at a rate of 200 µm/h or more is of the quality equal to or higher than that of a GaN crystal grown at a rate of about 100 µm/h.

It is understood form this that the use of a GaN seed crystal which has, like a GaN {10-1-1} wafer, a semi-polar surface whose low index orientation parallel or nearest parallel to the normal direction is <10-1-1> is particularly advantageous in efficiently producing high quality GaN crystals.

When a GaN substrate is used as a GaN seed crystal, GaN grown on the GaN substrate may be a film whose thickness is equal to or less than the thickness of the GaN substrate or may be a bulk crystal whose maximum growth height on a main surface of the GaN substrate is greater than the thickness of the GaN substrate.

The growth height herein refers to the height of a bulk GaN crystal grown on a base GaN surface when the base GaN surface is used as a reference plane, in other words, the distance from the base GaN surface to the top surface of the bulk GaN crystal. The maximum growth height refers to a growth height at a position where the above-defined growth height is the maximum.

When a bulk GaN crystal is grown on a GaN substrate, the bulk GaN crystal may have, on a main surface of the GaN substrate, a maximum growth height of 300 µm or more and less than 500 µm, 500 µm or more and less than 1 mm, 1 mm or more and less than 3 mm, 3 mm or more and less than 5 mm, 5 mm or more and less than 10 mm, 10 mm or more and less than 25 mm, 25 mm or more and less than 50 mm, 50 mm or more and less than 75 mm, 75 mm or more and less than 100 mm, or 100 mm or more and less than 200 mm, for example.

When a GaN seed crystal has two or more surfaces on which GaN can be grown by vapor phase epitaxy using $GaCl_3$ and $NH_3$ as raw materials, GaN can be grown on each of such surfaces at the growth rate described above.

For instance, when the GaN seed crystal illustrated in FIG. 4 or 5 is used, GaN is growable on each of the six {10-10} facets and the six {10-1-1} facets at a growth rate of 1 µm/h or more.

For instance, when the GaN seed crystal illustrated in FIG. 7 is used, GaN is growable on each of the six {10-10} facets, the six {10-1-1} facets, and the (000-1) facet at a growth rate of 1 µm/h or more.

The growth of GaN on a GaN seed crystal may be repeated intermittently. In other words, the growth of GaN may be separated into and carried out in a plurality of growth batches. In such a case, the second or subsequent growth is generally called regrowth.

When the growth of GaN is separated into and carried out in N growth batches, the crystal growth apparatus and/or the crystal growth conditions used in the n-th growth batch and the (n+1)th growth batch may be the same or different, where N is an integer of 2 or greater, and n is an integer of from 1 to (N−1). Before the (n+1)th growth batch, a crystal surface formed during the n-th growth batch may be subjected to cleaning including etching.

In one example, by adding a trace amount of oxygen gas ($O_2$) to a carrier gas or by introducing an inert gas added with a trace amount of oxygen gas into the second reaction tube 120 together with other gases, grown GaN can be doped with oxygen. Since oxygen (O) acts as a donor in GaN and generates an n-type carrier, GaN doped with oxygen exhibits n-type conductivity.

2. Use

The GaN crystal production method according to the embodiments may be used for various purposes such as formation of a GaN film for nitride semiconductor devices and production of bulk GaN crystals.

A nitride semiconductor device is a semiconductor device in which a nitride semiconductor is used for a central part of a device structure. Nitride semiconductors are also referred to as, for example, nitride-based Group III-V compound semiconductors, group III nitride compound semiconductors, and GaN-based semiconductors, and include, in addition to GaN, a compound in which Ga in GaN is partially or fully substituted with another periodic table Group 13 element (such as B, Al, and In). Specific examples of such a compound include AlN, InN, AlGaN, AlInN, GaInN, and AlGaInN.

Specific examples of the nitride semiconductor device include light emitting devices such as light emitting diodes and laser diodes, electronic devices such as rectifiers, bipolar transistors, field effect transistors, and HEMTs (High Electron Mobility Transistors), semiconductor sensors such as temperature sensors, pressure sensors, radiation sensors, and visible-ultraviolet light detectors, SAW (Surface Acoustic Wave) devices, vibrators, resonators, oscillators, MEMS (Micro Electro Mechanical System) components, voltage actuators, and solar cells.

A bulk GaN crystal produced by the GaN crystal production method according to the embodiments may be used as a material for a GaN wafer (GaN single crystal substrate). That is, by producing a bulk GaN crystal using the GaN crystal production method according to the embodiments and then processing the produced bulk GaN crystal, a GaN wafer may be produced.

Depending on the size of the bulk GaN crystal and the size of the GaN wafer to be produced, a necessary processing may be selected suitably from gliding, lapping, CMP, etching, slicing, coring, a laser processing, and the like.

When a bulk GaN crystal has a sufficiently large size, by slicing the bulk GaN crystal in an arbitrary direction, a GaN wafer having an arbitrary surface orientation is obtainable. The obtained GaN wafer may be a {10-10} wafer, a {30-3-1} wafer, a {20-2-1} wafer, a {30-3-2} wafer, a {10-1-1} wafer, a {30-31} wafer, a {20-21} wafer, a {30-32} wafer, a {10-11} wafer, a (0001) wafer or a (000-1) wafer.

It is noted that a surface orientation attached to a name of a GaN wafer is the orientation of a low-index plane which is parallel or nearest parallel to, out of main surfaces of the wafer, the main surface that is finished to be usable for epitaxial growth. For instance, a GaN wafer having a (30-3-1) surface which has been brought into an epi-ready state by a CMP processing is referred to as a {30-3-1} wafer.

An actual main surface of a wafer is often slightly tilted from the low-index plane attached to the name of the wafer. Such a wafer is sometimes referred to as being "off cut". The angle of the tilt is referred to as an off-angle, which is usually 5° or less and may be 4° or less, 3° or less, 2° or less, or 1° or less.

Slicing of a bulk GaN crystal may be performed using a wire saw, an inner peripheral blade slicer or the like. Usually, an as-sliced surface of a blank wafer obtained by slicing is planarized by mechanical abrasion (gliding and/or lapping) and then subjected to at least one processing selected from CMP, dry etching, and wet etching to thereby remove a damaged layer formed by the mechanical abrasion on the surface.

A GaN wafer may be preferably used as a substrate for a nitride semiconductor device. More specifically, by using thin film forming technology such as MOCVD, MBE, pulsed vapor deposition, and sputtering, one or more nitride semiconductor thin films may be grown on a GaN wafer to form various device structures.

In addition, a GaN wafer may be used as a seed crystal for growing a bulk GaN crystal.

3. Experimental Results

In the experiments described hereinafter, a vapor phase growth apparatus of the same type as illustrated in FIGS. 10 and 11 was used. More specifically, the apparatus used was a vapor phase growth apparatus having: a first reaction tube made of quartz and having a first zone and a second zone provided therein; and a second reaction tube made of quartz and having a growth zone provided therein. As described above, $Cl_2$ and metal Ga react with each other to generate GaCl in the first zone, GaCl generated in the first zone reacts with $Cl_2$ to generate $GaCl_3$ in the second zone, and gaseous gallium chloride including $GaCl_3$ and $NH_3$ react with each other to generate GaN which is epitaxially grown on a GaN seed crystal in the growth zone.

Hereinafter, when a gas flow rate is mentioned, it means a volumetric flow rate which has been converted into that in a standard state (flow rate represented by a unit such as "sccm"), unless otherwise noted.

Hereinafter, a "first main surface" of a GaN substrate refers to the main surface on which the growth of a GaN crystal was tried or the main surface which was used for the growth of a GaN crystal.

3.1. Experiment 1

As seed crystals, nine GaN substrates A to I having different surface orientations as shown in Table 1 below were prepared.

All of the GaN substrates A to I were GaN single crystal substrates and fabricated each in the following procedure.
(a) On a C-plane GaN/sapphire template, a bulk GaN crystal was grown by an HVPE method using hydrogen chloride (HCl).
(b) The bulk GaN crystal was sliced with a wire saw to provide an as-sliced substrate having a predetermined surface orientation.
(c) Each main surface of the as-sliced substrate was planarized by mechanical abrasion and then subjected to CMP (Chemical Mechanical Polishing) whereby a damaged layer and scratches formed by the mechanical abrasion were removed.

TABLE 1

| | Surface orientation of first main surface | Angle formed between normal direction of first main surface and [0001] direction | Direction of intersection line between first main surface and C-plane |
|---|---|---|---|
| GaN substrate A | (000-1) | 180° | — |
| GaN substrate B | (10-1-1) | 118° | a-axis direction |
| GaN substrate C | (20-2-1) | 105° | a-axis direction |
| GaN substrate D | (30-3-1) | 100° | a-axis direction |
| GaN substrate E | (10-10) (off-angled) | 95° | a-axis direction |
| GaN substrate F | (30-31) | 80° | a-axis direction |
| GaN substrate G | (20-21) | 75° | a-axis direction |
| GaN substrate H | (10-11) | 62° | a-axis direction |
| GaN substrate I | (0001) | 0° | — |

While Table 1 indicates the surface orientation of the first main surface of the GaN substrate E as (10-10) for convenience, the surface orientation of the first main surface of the GaN substrate E was approximately in the middle of (10-10) and (30-3-1).

Using the above-described vapor phase growth apparatus, it was examined whether or not the growth of GaN from $GaCl_3$ and $NH_3$ would occur on the respective first main surfaces of the GaN substrates A to I. The conditions were as shown in Table 2 below, and the growth time was set to 2 hours.

TABLE 2

| First zone | Carrier gas | $N_2$ |
| | $Cl_2$ partial pressure | $2.5 \times 10^{-3}$ atm |
| | Temperature | 850° C. |

TABLE 2-continued

| | | |
|---|---|---|
| Second zone | Carrier gas | $N_2$ |
| | $Cl_2$ partial pressure | $4.8 \times 10^{-3}$ atm |
| | Temperature | 850° C. |
| Growth zone | Carrier gas | $N_2$ |
| | $NH_3$ partial pressure | $2.0 \times 10^{-1}$ atm |
| | $GaCl_3$ partial pressure | $4.8 \times 10^{-3}$ atm |
| | Growth temperature | 1280° C. |

The $Cl_2$ partial pressure in the first zone shown in Table 2 was calculated from Formula 1 below.

$$P1(Cl_2)=P1(t) \times F1(Cl_2)/\{F1(Cl_2)+F1(N_2)\} \quad \text{Formula 1}$$

In the Formula 1,
P1 ($Cl_2$) denotes the $Cl_2$ partial pressure in the first zone,
P1 (t) denotes the total pressure (1 atm) in the first zone,
F1 ($Cl_2$) denotes the flow rate of $Cl_2$ supplied to the first zone, and
F1 ($N_2$) denotes the flow rate of the carrier gas ($N_2$) supplied to the first zone.

The $Cl_2$ partial pressure in the second zone shown in Table 2 was calculated from Formula 2 below.

$$P2(Cl_2)=P2(t) \times F2(Cl_2)/\{F1(N_2)+F2(Cl_2)+F2(N_2)\} \quad \text{Formula 2}$$

In the Formula 2,
P2 ($Cl_2$) denotes the $Cl_2$ partial pressure in the second zone,
P2 (t) denotes the total pressure (1 atm) in the second zone,
F1 ($N_2$) denotes the flow rate of the carrier gas ($N_2$) supplied to the first zone,
F2 ($Cl_2$) denotes the flow rate of $Cl_2$ supplied to the second zone, and
F2 ($N_2$) denotes the flow rate of the carrier gas ($N_2$) supplied to the second zone.

In Table 2, it is assumed that the $GaCl_3$ partial pressure in the growth zone is equal to the $Cl_2$ partial pressure in the second zone.

The $NH_3$ partial pressure in the growth zone shown in Table 2 was calculated from Formula 3 below.

$$PG(NH_3)=PG(t) \times FG(NH_3)/\{F1(N_2)+F2(Cl_2)+F2(N_2)+FG(NH_3)+FG(N_2)\} \quad \text{Formula 3}$$

In the Formula 3,
PG ($NH_3$) denotes the $NH_3$ partial pressure in the growth zone,
PG (t) denotes the total pressure (1 atm) in the growth zone,
F1 ($N_2$) denotes the flow rate of the carrier gas ($N_2$) supplied to the first zone,
F2 ($Cl_2$) denotes the flow rate of $Cl_2$ supplied to the second zone,
F2 ($N_2$) denotes the flow rate of the carrier gas ($N_2$) supplied to the second zone,
FG ($NH_3$) denotes the flow rate of $NH_3$ supplied to the growth zone, and
FG ($N_2$) denotes the flow rate of the carrier gas ($N_2$) supplied to the growth zone.

At an elapse of growth time of 2 hours, the supply of $GaCl_3$ to the growth zone and heating of the GaN substrate were stopped. After the temperature of the reaction tube had dropped to room temperature, the GaN substrate was taken out of the vapor phase growth apparatus, and the thickness of the grown GaN layer was examined with a fluorescence microscope.

The result showed that for the GaN substrates A to E each having a first main surfaces whose normal direction forms an angle of 95° or more with the [0001] direction of the GaN substrate, GaN layers each having a thickness of more than 100 μm were grown on the first main surfaces. In contrast, for the GaN substrates F to I where the angle was 80° or less, no GaN growth on the first main surface was observed.

Regarding the GaN growth rates calculated from the growth time and the thickness of the GaN layers grown on the respective first main surfaces, while the growth rate was 88 μm/h on the GaN substrate A, the growth rates were higher than 100 μm/h on the GaN substrates B to D and higher than 200 μm/h on the GaN substrate E. In calculating the growth rate, when the thickness of the GaN layer is not uniform within the layer, the maximum thickness (thickness at a position where the thickness is the maximum) was used.

Measurement of X-ray rocking curves confirmed that the GaN layers grown respectively on the GaN substrates A to E were single crystal layers formed through epitaxial growth. The X-ray rocking curve measurement was performed by using an X-ray diffractometer using CuKα as an X-ray source (the same applies to the measurement of an X-ray rocking curve in other experiments).

The results obtained in Experiment 1 are shown summarized in Table 3.

TABLE 3

| | Growth of GaN layer | Thickness of GaN layer (μm) | Growth rate of GaN (μm/h) | X-ray rocking curve | |
|---|---|---|---|---|---|
| | | | | Reflection plane | FWHM (arcsec) |
| GaN substrate A | Yes | 175 | 88 | (002) | 539 |
| | | | | (102) | 595 |
| GaN substrate B | Yes | 280 | 140 | (101) | 90 |
| GaN substrate C | Yes | 265 | 133 | (201) | 67 |
| GaN substrate D | Yes | 330 | 165 | (301) | 112 |
| GaN substrate E | Yes | 420 | 210 | (100) | 235 |
| GaN substrate F | No | 0 | 0 | — | |
| GaN substrate G | No | 0 | 0 | — | |
| GaN substrate H | No | 0 | 0 | — | |
| GaN substrate I | No | 0 | 0 | — | |

3.2. Experiment 2

Using the same vapor phase growth apparatus as in Experiment 1, GaN was grown on the above-described GaN substrates A to E. Except for the growth temperature, the growth conditions were the same as the conditions shown in Table 2 above.

As a result, GaN growth rates on the respective first main surfaces of the GaN substrates were as shown in Table 4 below.

TABLE 4

| | | Growth temperature | | |
|---|---|---|---|---|
| | | 1230° C. | 1280° C. | 1330° C. |
| Growth rate of GaN (μm/h) | GaN substrate A | 103 | 88 | 38 |
| | GaN substrate B | 150 | 140 | 50 |
| | GaN substrate C | 158 | 133 | 153 |
| | GaN substrate D | 180 | 165 | 160 |
| | GaN substrate E | 194 | 210 | 240 |

3.3. Experiment 3

As seed crystals, two types of GaN substrates J and K shown in Table 5 below were prepared.

The GaN substrates J and K were GaN single crystal substrates and fabricated in the same manner as the above-described GaN substrates A to I.

The GaN substrate J was a (10-10) substrate (M-plane substrate) having an off-angle of +1° in the [0001] direction and 3° in the a-axis direction.

The GaN substrate K was a (10-10) substrate (M-plane substrate) having an off-angle of +3° in the [0001] direction and 3° in the a-axis direction.

TABLE 5

| | Surface orientation of first main surface | Angle formed between normal direction of first main surface and [0001] direction | Direction of intersection line between first main surface and C-plane |
|---|---|---|---|
| GaN substrate J | (10-10) (off-angled) | 89° | +3° in a-axis direction |
| GaN substrate K | (10-10) (off-angled) | 87° | +3° in a-axis direction |

Using the same vapor phase growth apparatus as in Experiment 1, it was examined whether or not the growth of GaN from $GaCl_3$ and $NH_3$ would occur on the respective first main surfaces of the GaN substrates J and K. The conditions were as shown in Table 6 below, and the growth time was set to 1 hour.

TABLE 6

| First zone | Carrier gas | $N_2$ |
|---|---|---|
| | $Cl_2$ partial pressure | $2.1 \times 10^{-3}$ atm |
| | Temperature | 850° C. |
| Second zone | Carrier gas | $N_2$ |
| | $Cl_2$ partial pressure | $4.1 \times 10^{-3}$ atm |
| | Temperature | 850° C. |

TABLE 6-continued

| Growth zone | Carrier gas | $N_2$ |
|---|---|---|
| | $NH_3$ partial pressure | $1.7 \times 10^{-1}$ atm |
| | $GaCl_3$ partial pressure | $4.1 \times 10^{-3}$ atm |
| | Growth Temperature | 1230° C. |

The method for calculating the gas partial pressures in the zones shown in Table 6 is the same as that in Experiment 1 above.

At an elapse of growth time of 1 hour, the supply of $GaCl_3$ to the growth zone and heating of the GaN substrate were stopped. After the temperature of the reaction tube had dropped to room temperature, the GaN substrate was taken out of the vapor phase growth apparatus, and the thickness of the grown GaN layer was examined with a fluorescence microscope.

The result showed that for both of the GaN substrates J and K, GaN layers each having a thickness of more than 100 μm were grown on the first main surfaces.

Measurement of X-ray rocking curves confirmed that the GaN layers grown respectively on the GaN substrates J and K were single crystal layers formed through epitaxial growth.

The results obtained in Experiment 3 are shown summarized in Table 7.

TABLE 7

| Growth of GaN layer | Growth of GaN layer | Thickness of GaN layer (μm) | Growth rate of GaN (μm/h) | X-ray rocking curve Reflection plane | X-ray rocking curve FWHM (arcsec) |
|---|---|---|---|---|---|
| GaN substrate J | Yes | 150 | 150 | (100) | 152 |
| GaN substrate K | Yes | 135 | 135 | (100) | 84 |

3.4. Experiment 4

Using the same vapor phase growth apparatus as in Experiment 1, GaN was grown on the first main surface of each of the above-described GaN substrates A and E under four sets of conditions (Conditions 1 to 4) shown in Table 8 below. The four sets of conditions differ in the product of the $GaCl_3$ partial pressure and the $NH_3$ partial pressure in the growth zone.

Table 8 also shows growth rates of GaN obtained under each set of conditions.

TABLE 8

| | Partial pressures of raw material gases in growth zone (atm) | | | Growth temperature (° C.) | Growth rate of GaN (μm/h) | |
|---|---|---|---|---|---|---|
| | $GaCl_3$ partial pressure (i) | $NH_3$ partial pressure (ii) | (i) * (ii) | | GaN substrate A | GaN substrate E |
| Condition 1 | $1.5 \times 10^{-3}$ | $6.3 \times 10^{-2}$ | $9.5 \times 10^{-5}$ | 1230 | 6 | 3 |
| Condition 2 | $1.6 \times 10^{-3}$ | $2.0 \times 10^{-1}$ | $3.2 \times 10^{-4}$ | 1230 | 30 | 34 |
| Condition 3 | $4.1 \times 10^{-3}$ | $1.7 \times 10^{-1}$ | $7.0 \times 10^{-4}$ | 1230 | 81 | 142 |
| Condition 4 | $4.9 \times 10^{-3}$ | $2.0 \times 10^{-1}$ | $9.8 \times 10^{-4}$ | 1230 | 119 | 195 |

Figure 12:
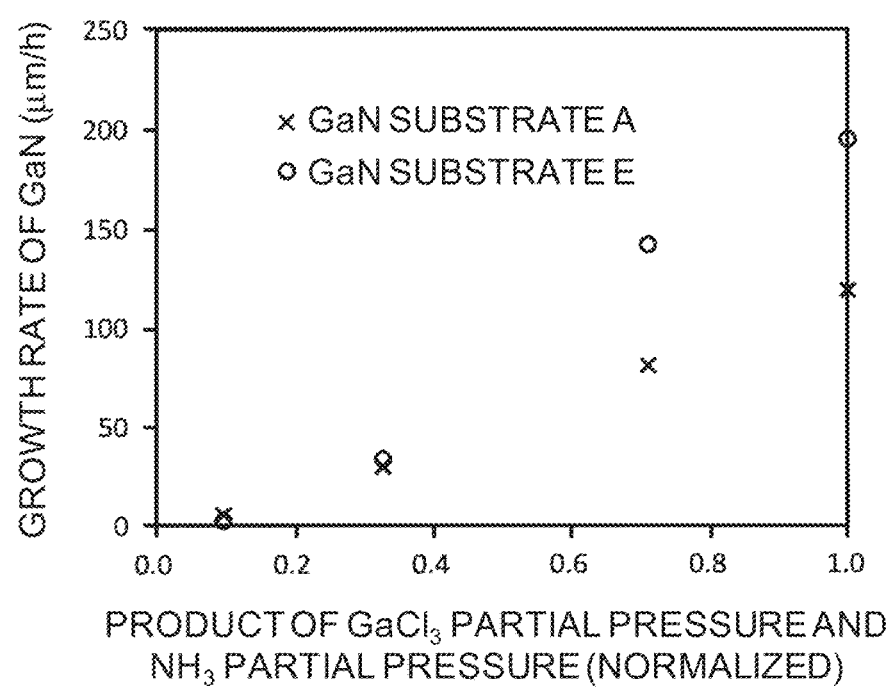
FIG. 12 is a graph showing the relationship between the growth rate of GaN and the product of a $GaCl_3$ partial pressure and an $NH_3$ partial pressure in a growth zone.

The results shown in Table 8 are plotted on a graph in FIG. 12. As shown in FIG. 12, the growth rate of GaN was approximately proportional to the product of the $GaCl_3$ partial pressure and the $NH_3$ partial pressure in the growth zone, and it was found that the growth rate of GaN is controllable by adjusting the partial pressures of raw material gases.

3.5. Experiment 5

Using the same vapor phase growth apparatus as in Experiment 1, GaN layers were grown from $GaCl_3$ and $NH_3$ on the respective first main surfaces of five GaN substrates (single crystal substrates) which differ in the orientations of the first main surfaces. The growth temperature was set to 1280° C. The concentrations of oxygen (O) and silicon (Si) contained in each of the GaN layers grown on the respective GaN substrates were measured by SIMS (Secondary Ion Mass Spectroscopy), and the results are shown in Table 9 below.

TABLE 9

| Orientation of first main surface of GaN substrate | Concentrations of impurities in GaN layer grown on GaN substrate | |
|---|---|---|
| | Oxygen (atoms/cm$^3$) | Silicon (atoms/cm$^3$) |
| (000-1) | $2 \times 10^{18}$ | $8 \times 10^{17}$ |
| (10-1-1) | $2 \times 10^{17}$ | $8 \times 10^{16}$ |
| (20-2-1) | $3 \times 10^{17}$ | $2 \times 10^{17}$ |
| (30-3-1) | $2 \times 10^{17}$ | $1 \times 10^{17}$ |
| (10-10) (off-angled) | $1 \times 10^{18}$ | $8 \times 10^{16}$ |

As shown in Table 9, silicon was detected from all the GaN layers. Since no silicon was intentionally added, the detected silicon is presumed to be derived from the material of the reaction tubes, specifically, quartz.

The GaN layers grown on the non-polar or semi-polar GaN surfaces each had a silicon concentration of less than $2 \times 10^{17}$ atms/cm$^3$, which was not more than one fourth of the concentration in the GaN layer grown on the (000-1) surface. This suggests that growth on a non-polar or semi-polar GaN surface is convenient for control of carrier concentration by oxygen doping.

3.6. Experiment 6

As a seed crystal, a GaN substrate L formed of a GaN single crystal grown by an ammonothermal method was prepared. The GaN substrate L was a (10-10) substrate (M-plane substrate) with an off-angle of +5° in the [0001] direction and had a first main surface whose normal direction forms an angle of 85° with the [0001] direction.

Using the same vapor phase growth apparatus as in Experiment 1, it was examined whether or not the growth of GaN would occur on the first main surface of the GaN substrate L in the growth zone under the following conditions: an GaCl$_3$ partial pressure of $4.8 \times 10^{-3}$ atm, an NH$_3$ partial pressure of $2 \times 10^{-1}$ atm, and a temperature of 1230° C. As a result, a GaN layer was grown at a rate of 40 μm/h. Measurement of an X-ray rocking curve confirmed that the GaN layer was a single crystal layer formed through epitaxial growth. The FWHM (Full Width at Half Maximum) of the measured X-ray rocking curve of the (100) plane was 30 arcsec.

3.7. Experiment 7

As seed crystals, two types of GaN substrates M and N each formed of a GaN single crystal grown by an ammonothermal method were prepared.

The GaN substrate M was a non-off-cut (10-10) substrate (M-plane substrate) and had a first main surface whose normal direction forms an angle of 90° with the [0001] direction.

The GaN substrate N was a (10-10) substrate (M-plane substrate) having an off-angle of −5° in the [0001] direction and had a first main surface whose normal direction forms an angle of 95° with the [0001] direction.

Using the same vapor phase growth apparatus as in Experiment 1, GaN was grown on the first main surface of each of the GaN substrates M and N under three sets of conditions shown in Table 10 below.

Table 10 also shows results of measurement of GaN growth rates under each set of conditions and FWHMs of (100) plane X-ray rocking curves measured on the grown GaN layers.

TABLE 10

| | Partial pressures of raw material gases in growth zone (atm) | | Growth temperature (° C.) | Growth rate of GaN (μm/h) | | (100) XRC-FWHM of grown GaN layer (arcsec) | |
|---|---|---|---|---|---|---|---|
| | GaCl$_3$ | NH$_3$ | | GaN substrate M | GaN substrate N | GaN substrate M | GaN substrate N |
| Condition 1 | $4.8 \times 10^{-3}$ | $2.0 \times 10^{-1}$ | 1230 | 225 | 245 | 252 | 178 |
| Condition 2 | $3.4 \times 10^{-3}$ | $1.4 \times 10^{-1}$ | 1230 | 164 | 194 | 251 | 172 |
| Condition 3 | $2.4 \times 10^{-3}$ | $1.0 \times 10^{-1}$ | 1230 | 125 | 115 | 74 | 59 |

To observe stacking faults, monochromatic CL (CathodoLuminescence) images of the surfaces of the grown GaN layers at a wavelength of 364 nm were obtained at a temperature of 83 K. Observation of the central portion of each sample for approximately 5 mm along the C-axis direction showed that the GaN layer grown on the GaN substrate M under Condition 2 or 3 as set out in Table 10 had a surface on which regions crowded with stacking faults existed everywhere, whereas the GaN layer grown on the GaN substrate N under the same Condition 2 or 3 had a surface on which relatively few stacking faults existed and regions crowded with stacking faults existed only partially.

3.8. Experiment 8

As a seed crystal, a GaN substrate O formed of a GaN single crystal grown by an ammonothermal method was prepared.

The GaN substrate O was a (10-1-1) substrate and had a first main surface whose normal direction forms an angle of 118° with the [0001] direction.

Using the same vapor phase growth apparatus as in Experiment 1, GaN was grown on the first main surface of the GaN substrate O under three sets of conditions shown in Table 11 below.

Table 11 also shows results of measurement of GaN growth rates under the respective sets of conditions and FWHMs of (101) plane X-ray rocking curves measured on the grown GaN layers.

TABLE 11

| | Partial pressures of raw material gases in growth zone (atm) | | Growth temperature (° C.) | GaN growth rate (μm/h) | (101) XRC-FWHM of grown GaN layer (arcsec) |
|---|---|---|---|---|---|
| | $GaCl_3$ | $NH_3$ | | | |
| Condition 1 | $4.8 \times 10^{-3}$ | $2.0 \times 10^{-1}$ | 1230 | 275 | 28 |
| Condition 2 | $3.4 \times 10^{-3}$ | $1.4 \times 10^{-1}$ | 1230 | 164 | 36 |
| Condition 3 | $2.4 \times 10^{-3}$ | $1.0 \times 10^{-1}$ | 1230 | 95 | 42 |

Further, (202) X-ray rocking curves of the GaN layer grown on the GaN substrate O under Condition 1 as set out in Table 11 were measured by using an X-ray diffractometer having a higher angular resolution [PANalytical X'Pert Pro MRD manufactured by Spectris Co., Ltd.]. Used as incident optics were a ½° divergence slit, a focusing mirror, a Ge (440) 4-crystal monochromator, and a cross slit of w 0.2 mm×h 1 mm. Used as receiving optics was the OD mode of a semiconductor pixel detector, PIXcel3D®. The optics had an angular resolution of 5 to 6 arcsec.

The beam size of the X-rays on the surface of the GaN layer was set so as to be 0.2 mm×5 mm when the incident angle of the X-rays was 90° (the incident direction of the X-rays was perpendicular to the surface of the GaN layer). At the time of measurement, the direction in which the beam size was 5 mm was kept perpendicular to the X-ray incidence plane.

First, X-ray rocking curve measurement was carried out at seven measurement points on a straight line passing through an approximate center of the surface of the GaN layer and parallel to the a-axis. The pitch between the measurement points was 1 mm. In each measurement, the X-ray incidence plane was kept parallel to the a-axis. In other words, an ω scan was performed by making X-rays incident on the surface of the GaN layer from a direction perpendicular to the c-axis.

Among the seven measurement points on the straight line parallel to the a-axis, FWHMs of (202) plane X-ray rocking curves had a maximum value of 26.8 arcsec, a minimum value of 14.9 arcsec, and a mean value of 18.1 arcsec.

Next, the measurement was carried out at seven measurement points on a straight line passing through an approximate center of the surface of the GaN layer and perpendicular to the a-axis. The pitch between the measurement points was 1 mm. In each measurement, the X-ray incident plane was kept perpendicular to the a-axis. In other words, an ω scan was performed by making X-rays incident on the surface of the GaN layer from a direction perpendicular to the a-axis.

Among the seven measurement points located on the straight line perpendicular to the a-axis, FWHMs of (202) plane X-ray rocking curves had a maximum value of 18.9 arcsec, a minimum value of 13.3 arcsec, and a mean value of 15.0 arcsec.

3.9. Experiment 9

In Experiment 9, GaN substrates P and Q were prepared to examine whether SAG (Selective Area Growth) of a GaN crystal using $GaCl_3$ and $NH_3$ as raw materials is feasible or not. The GaN substrate P had a pattern mask arranged on the first main surface of a (000-1) substrate equivalent in quality to the above-described GaN substrate A, while the GaN substrate Q had a pattern mask arranged on the first main surface of a (10-10) substrate, with an off-angle of −5° in the [0001] direction, equivalent in quality to the above-described GaN substrate E.

The pattern masks arranged on the respective first main surfaces of the GaN substrates P and Q were formed as follows: after deposition of 80 nm-thick $SiN_x$ thin film by a plasma CVD method, circular openings each with a diameter of 5 μm and arranged at a pitch of 10 μm in a closest packed manner were provided in the thin film by using conventional photolithography and etching technique.

Using the same vapor phase growth apparatus as in Experiment 1, GaN were grown from $GaCl_3$ and $NH_3$ on the respective first main surfaces of the GaN substrates P and Q. The $GaCl_3$ partial pressure and the $NH_3$ partial pressure in the growth zone were set to $2.2 \times 10^{-3}$ atm and $9.0 \times 10^{-2}$ atm, respectively. Two different growth temperatures of 1050° C. and 1230° C. were used.

As a result, SAG was observed on both of the GaN substrates P and Q and at both growth temperatures. Specifically, as a result of brief growth, GaN islands were formed over the circular openings in the pattern masks.

Figure 13A:
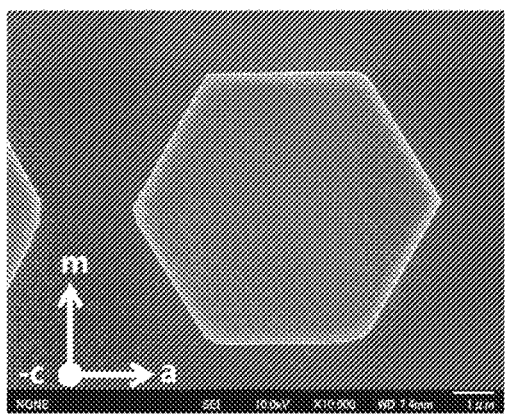
FIG. 13A is a planar image illustrating SEM image (photographs) of a GaN island formed by SAG on a GaN substrate.
Figure 13B:
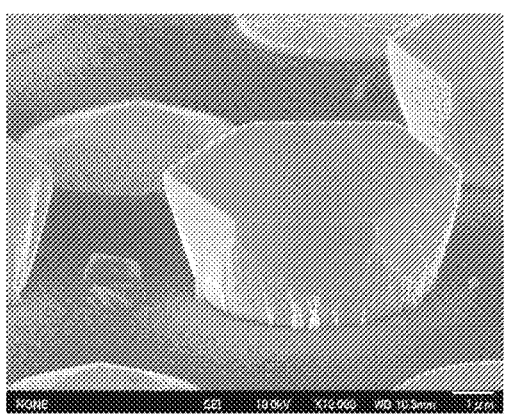
FIG. 13B is a bird's-eye image illustrating SEM image (photograph) of a GaN island formed by SAG on a GaN substrate.

A planar SEM image and a bird's-eye SEM image of a GaN island formed by SAG on the GaN substrate P at a growth temperature of 1050° C. are illustrated in FIG. 13A and FIG. 13B, respectively.

Figure 14A:
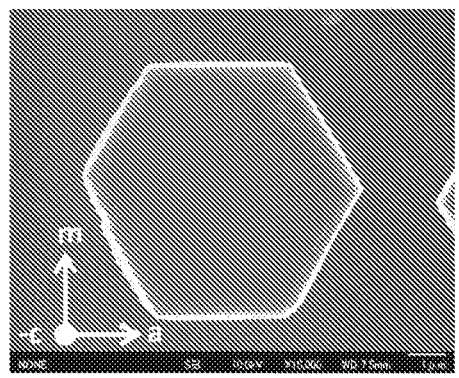
FIG. 14A is a planar image illustrating SEM image (photograph) of a GaN island formed by SAG on a GaN substrate.
Figure 14B:
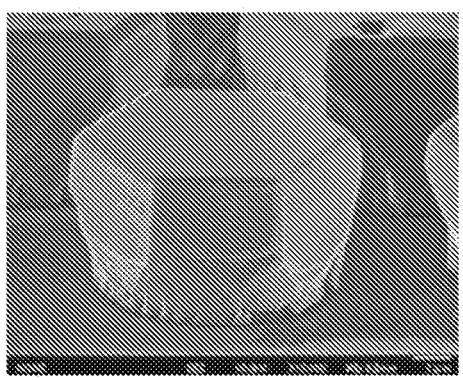
FIG. 14B is a bird's-eye image illustrating SEM image (photograph) of a GaN island formed by SAG on a GaN substrate.

A planar SEM image and a bird's-eye SEM image of a GaN island formed by SAG on the GaN substrate P at a growth temperature of 1230° C. are illustrated in FIG. 14A and FIG. 14B, respectively.

Figure 15A:
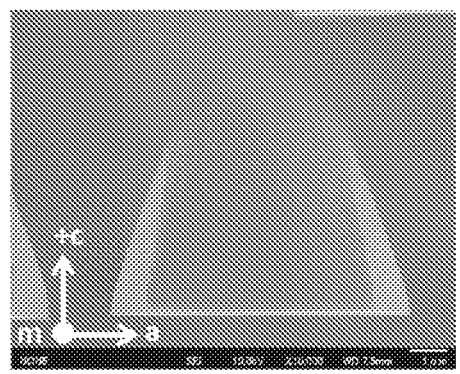
FIG. 15A is a planar image illustrating SEM image (photographs) of a GaN island formed by SAG on a GaN substrate.
Figure 15B:
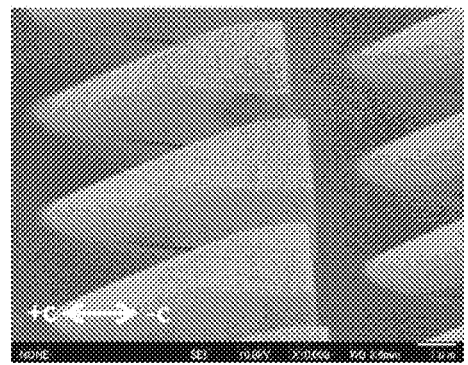
FIG. 15B is a bird's-eye image illustrating SEM image (photograph) of a GaN island formed by SAG on a GaN substrate.

A planar SEM image and a bird's-eye SEM image of a GaN island formed by SAG on the GaN substrate Q at a growth temperature of 1050° C. are illustrated in FIG. 15A and FIG. 15B, respectively.

Figure 16A:
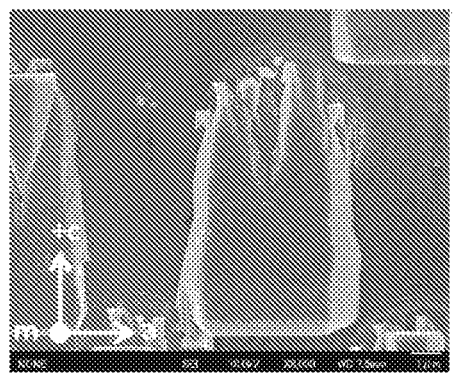
FIG. 16A is a planar image illustrating SEM image (photograph) of a GaN island formed by SAG on a GaN substrate.
Figure 16B:
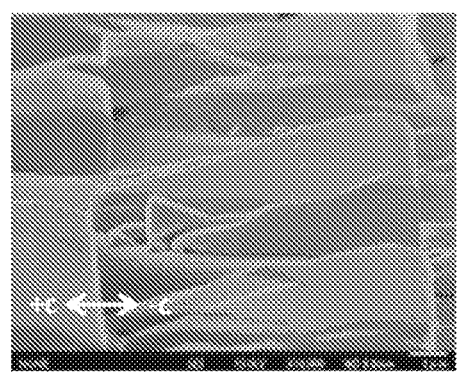
FIG. 16B is a bird's-eye image illustrating SEM image (photograph) of a GaN island formed by SAG on a GaN substrate.

A planar SEM image and a bird's-eye SEM image of a GaN island formed by SAG on the GaN substrate Q at a growth temperature of 1230° C. are illustrated in FIG. 16A and FIG. 16B, respectively.

As shown in FIGS. 13A, 13B, 15A and 15B, on the surfaces of the GaN islands formed at a temperature of 1050° C., clear (000-1) facets and {10-10} facets appeared, whereas neither a {11-20} facet nor a {hkil} facet where l>0 was observed. Here, a {hkil} facet where l>0 is a facet whose normal direction forms an angle of less than 90° with the [0001] direction, which includes a (0001) facet.

As shown in FIGS. 13A and 13B, the GaN islands grown on the GaN substrate P each had an upper portion in a shape of a hexagonal prism terminating with a flat top surface, and the top surface was a (000-1) facet while the side surfaces of the hexagonal prism were {10-11} facets. The orientation of the top surface was confirmed by examining whether the top surface was etched with KOH or not. It is known that in GaN, a (0001) surface is not substantially etched with KOH, whereas a (000-1) surface is easily etched with KOH.

As shown in FIGS. 14A, 14B, 16A and 16B, on the surfaces of the GaN islands grown at a temperature of 1230° C., clear (000-1) facets, {10-1-1} facets, and {10-10} facets appeared, whereas neither a {11-20} facet nor a {hkil} facet where l>0 was observed.

As shown in FIGS. 14A and 14B, the GaN islands grown on the GaN substrate P each had an upper portion in a shape of a hexagonal prism terminating with a flat top surface, and the top surface was a (000-1) facet while the side surfaces of the hexagonal prism were {10-10} facets. Between the (000-1) facet and each of the {10-10} facets, a {10-1-1} facet was formed as a chamfer.

The GaN islands formed as a result of SAG over the openings of the pattern masks each had a shape called quasi-equilibrium crystal shape, and the facets appearing on the surfaces of the GaN islands indicate stable faces in the growth system of a GaN crystal from $GaCl_3$ and $NH_3$. Even when a bulk GaN crystal grows from $GaCl_3$ and $NH_3$, the facets observed on the GaN islands are predicted to appear on the surfaces of the bulk GaN crystal.

When the GaN crystals were allowed to continue growing on the GaN substrates P and Q after the GaN islands had been formed, regardless of whether at a temperature of 1050° C. or 1230° C., coalescence between the GaN islands occurred, and GaN layers each covering the entire first main surface of the substrate were formed. Regardless of whether on the GaN substrate P or on the GaN substrate Q, the formed GaN layers each had a top surface with high flatness.

For comparison, GaN crystals were grown on the GaN substrates P and Q using the same vapor phase growth apparatus as in the above-described experiments but under the condition without any supply of $Cl_2$ to the second zone. When no $Cl_2$ is supplied to the second zone, GaCl is substantially the only source of Ga to be supplied to the growth zone. SEM images of GaN islands formed under such a condition as a result of brief growth on the substrates are illustrated in FIGS. 17A, 17B, 18A and 18B.

Figure 17A:
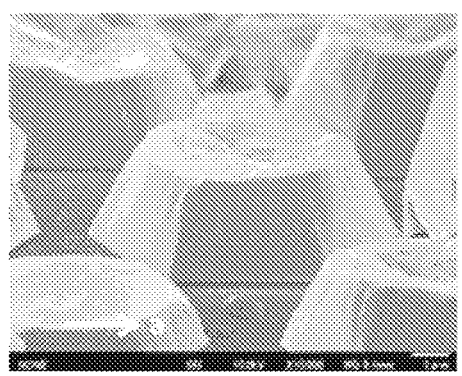
FIG. 17A is a bird's-eye SEM image of a GaN island formed by SAG on a GaN (000-1) substrate (photograph).
Figure 17B:
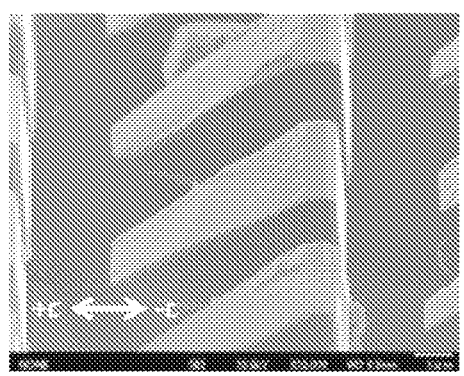
FIG. 17B is bird's-eye SEM image of a GaN island formed by SAG on a GaN (10-10) substrate (photograph).

FIGS. 17A and 17B illustrate bird's-eye SEM images of the GaN islands grown at a temperature of 1050° C., where FIG. 17A illustrates the island grown on the GaN substrate P, while FIG. 17B illustrate the islands grown on the GaN substrate Q.

As shown in FIG. 17A, no clear facet was observed on the surfaces of the GaN islands grown at a temperature of 1050° C. on the GaN substrate P from GaCl and $NH_3$.

On the other hand, as shown in FIG. 17B, on the surfaces of the GaN islands grown at a temperature of 1050° C. on the GaN substrate Q from GaCl and $NH_3$, in addition to (000-1) facets, {10-1-1} facets, and {10-10} facets, {10-11} facets were also observed.

Figure 18A:
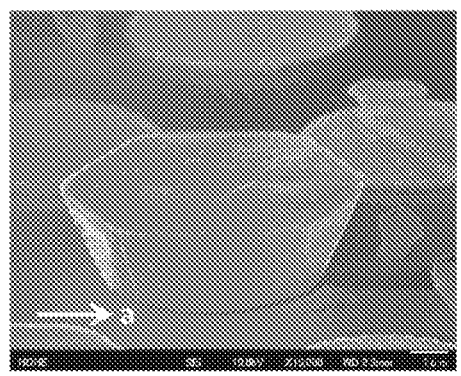
FIG. 18A is a bird's-eye SEM image of a GaN island formed by SAG on a GaN (000-1) substrate (photograph).
Figure 18B:
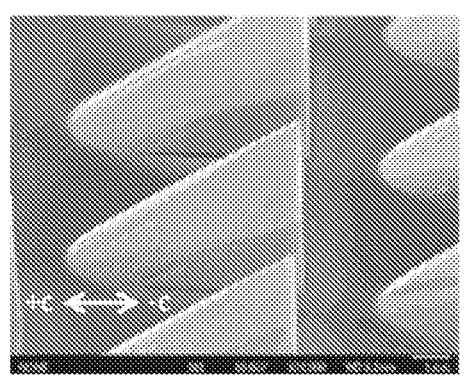
FIG. 18B is bird's-eye SEM image of a GaN island formed by SAG on a GaN (10-10) substrate (photograph).

FIGS. 18A and 18B illustrate bird's-eye SEM images of the GaN islands grown at a temperature of 1230° C., where FIG. 18A illustrates the island grown on the GaN substrate P, while FIG. 18B illustrates the island grown on the GaN substrate Q.

As shown in FIGS. 18A and 18B, regardless of whether on the GaN substrate P or on the GaN substrate Q, on the surfaces of the GaN islands grown at a temperature of 1230° C. from GaCl and $NH_3$, only (000-1) facets appeared, and neither a non-polar {10-10} facet nor a semi-polar {10-1-1} facet was observed.

Although the present invention has been specifically described with reference to the embodiments as above, each embodiment was presented as an example and does not limit the scope of the present invention. Each of the embodiments described herein can be various modified within the scope not departing from the spirit of the present invention, and can be combined with any feature described in other embodiments as long as such a combination can be carried out.

REFERENCE SIGNS LIST

10 GaN Substrate
11 first main surface
12 second main surface
13 side surface
100 vapor phase growth apparatus
110 first reaction tube
111 first $Cl_2$ supply port
112 second $Cl_2$ supply port
113 gas outlet
114 funnel-shaped tube
115 baffle
120 second reaction tube
121 $NH_3$ supply port
122 exhaust port
130 susceptor
Z1 first zone
Z2 second zone
Z3 growth zone

What is claimed is:

1. A method for producing a GaN crystal, the method comprising:
   (i) a seed crystal preparation step of preparing a GaN seed crystal having one or more facets selected from a {10-10} facet and a {10-1-1} facet; and
   (ii) a growth step of growing GaN from vapor phase on a surface comprising the one or more facets of the GaN seed crystal using $GaCl_3$ and $NH_3$ as raw materials.

2. The method for producing a GaN crystal according to claim 1, wherein in the GaN seed crystal, a ratio of a size in a direction of a c-axis to a size in an arbitrary direction perpendicular to the c-axis is not less than 0.1 and not more than 10.

3. The method for producing a GaN crystal according to claim 1, wherein each of the one or more facets is an as-grown surface.

4. The method for producing a GaN crystal according to claim 1, wherein the GaN seed crystal further has a (000-1) facet.

5. The method for producing a GaN crystal according to claim 4, wherein in the growth step, GaN is also grown on the (000-1) facet.

6. The method for producing a GaN crystal according to claim 1, wherein in the growth step, GaN is grown on each of the one or more facets at a growth rate of 1 μm/h or more.

7. The method for producing a GaN crystal according to claim 6, wherein the growth rate is 50 μm/h or more.

8. The method for producing a GaN crystal according to claim 6, wherein the growth rate is less than 150 μm/h.

9. The method for producing a GaN crystal according to claim 1, wherein in the growth step, $GaCl_3$ is supplied to the GaN seed crystal at a partial pressure of $1.5 \times 10^{-3}$ atm or more.

10. The method for producing a GaN crystal according to claim 1, wherein in the growth step, a product of partial pressures of $GaCl_3$ and $NH_3$ supplied to the GaN seed crystal is $9.5 \times 10^{-5}$ atm$^2$ or more.

11. The method for producing a GaN crystal according to claim 1, wherein in the growth step, growth of GaN is repeated intermittently.

12. The method for producing a GaN crystal according to claim 1, wherein the $GaCl_3$ is generated by reacting metal Ga and $Cl_2$ with each other to produce GaCl and reacting the produced GaCl with $Cl_2$.

13. The method for producing a GaN crystal according to claim 1, wherein in the growth step, GaN is grown at a growth temperature of 1200° C. or more.

14. A method for producing a GaN wafer, the method comprising:
   a crystal production step of producing a GaN crystal by the method for producing a GaN crystal according to claim 1; and
   a crystal processing step of processing the GaN crystal produced in the crystal production step to form at least one GaN wafer.

15. The method for producing a GaN wafer according to claim 14, wherein the GaN wafer formed in the crystal processing step includes a GaN wafer selected from a {10-10} wafer, a {30-3-1} wafer, a {20-2-1} wafer, a {30-3-2} wafer, a {10-1-1} wafer, a {30-31} wafer, a {20-21} wafer, a {30-32} wafer, a {10-11} wafer, a (0001) wafer, and a (000-1) wafer.

* * * * *